United States Patent
Ito et al.

(10) Patent No.: US 10,978,490 B2
(45) Date of Patent: Apr. 13, 2021

(54) OXIDE SEMICONDUCTOR, THIN FILM TRANSISTOR, AND DISPLAY DEVICE

(71) Applicant: Semiconductor Energy Laboratory Co., Ltd., Atsugi (JP)

(72) Inventors: Shunichi Ito, Atsugi (JP); Toshinari Sasaki, Atsugi (JP); Miyuki Hosoba, Isehara (JP); Junichiro Sakata, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/535,698

(22) Filed: Aug. 8, 2019

(65) Prior Publication Data
US 2019/0371824 A1    Dec. 5, 2019

Related U.S. Application Data

(60) Continuation of application No. 16/161,573, filed on Oct. 16, 2018, now Pat. No. 10,692,894, which is a
(Continued)

(30) Foreign Application Priority Data

Oct. 24, 2008    (JP) .................... 2008-274564

(51) Int. Cl.
   *H01L 27/12*    (2006.01)
   *H01L 29/24*    (2006.01)
   (Continued)

(52) U.S. Cl.
   CPC ........... *H01L 27/1225* (2013.01); *G09G 3/20* (2013.01); *H01L 27/1248* (2013.01);
   (Continued)

(58) Field of Classification Search
   CPC ... H01L 29/786; H01L 29/7869–78696; H01L 27/3241; H01L 27/3244;
   (Continued)

(56) References Cited

U.S. PATENT DOCUMENTS 5,623,157 A    4/1997    Miyazaki et al.
5,731,856 A    3/1998    Kim et al.
(Continued)

FOREIGN PATENT DOCUMENTS

CN    001614767 A    5/2005
CN    101060139 A    10/2007
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(Continued)

*Primary Examiner* — Sonya McCall-Shepard
(74) *Attorney, Agent, or Firm* — Robinson Intellectual Property Law Office; Eric J. Robinson

(57) ABSTRACT

An object is to control composition and a defect of an oxide semiconductor, another object is to increase a field effect mobility of a thin film transistor and to obtain a sufficient on-off ratio with a reduced off current. A solution is to employ an oxide semiconductor whose composition is represented by $InMO_3(ZnO)_m$, where M is one or a plurality of elements selected from Ga, Fe, Ni, Mn, Co, and Al, and m is preferably a non-integer number of greater than 0 and less than 1. The concentration of Zn is lower than the concentrations of In and M. The oxide semiconductor has an
(Continued)

amorphous structure. Oxide and nitride layers can be provided to prevent pollution and degradation of the oxide semiconductor.

14 Claims, 18 Drawing Sheets

Related U.S. Application Data division of application No. 15/480,560, filed on Apr. 6, 2017, now Pat. No. 10,141,343, which is a division of application No. 14/822,995, filed on Aug. 11, 2015, now Pat. No. 9,647,137, which is a continuation of application No. 14/496,404, filed on Sep. 25, 2014, now Pat. No. 9,111,806, which is a continuation of application No. 12/581,187, filed on Oct. 19, 2009, now Pat. No. 8,878,172.

(51) Int. Cl.
| | |
|---|---|
| H01L 29/786 | (2006.01) |
| H01L 29/45 | (2006.01) |
| G09G 3/20 | (2006.01) |
| H01L 29/66 | (2006.01) |

(52) U.S. Cl.
CPC ........ *H01L 27/1259* (2013.01); *H01L 29/247* (2013.01); *H01L 29/45* (2013.01); *H01L 29/66969* (2013.01); *H01L 29/7869* (2013.01); *H01L 29/78618* (2013.01); *H01L 29/78693* (2013.01); *H01L 29/78696* (2013.01)

(58) Field of Classification Search
CPC ............. H01L 27/3262; H01L 27/3265; H01L 27/1248; H01L 33/36; H01L 33/38; H01L 33/385; H01L 33/387; H01L 51/5012; H01L 27/1214–1248; H01L 33/40; H01L 33/42; H01L 2933/0016; H01L 2933/0066; H01L 51/5203–5228; H01L 33/62

See application file for complete search history.

(56) References Cited

U.S. PATENT DOCUMENTS

| | | | |
|---|---|---|---|
| 5,744,864 A | 4/1998 | Cillessen et al. |
| 5,847,410 A | 12/1998 | Nakajima |
| 5,949,271 A | 9/1999 | Fujikura |
| 6,294,274 B1 | 9/2001 | Kawazoe et al. |
| 6,555,420 B1 | 4/2003 | Yamazaki |
| 6,563,174 B2 | 5/2003 | Kawasaki et al. |
| 6,586,346 B1 | 7/2003 | Yamazaki et al. |
| 6,600,524 B1 | 7/2003 | Ando et al. |
| 6,727,522 B1 | 4/2004 | Kawasaki et al. |
| 6,881,679 B2 | 4/2005 | Jo et al. |
| 6,909,114 B1 | 6/2005 | Yamazaki |
| 6,960,812 B2 | 11/2005 | Yamazaki et al. |
| 7,049,190 B2 | 5/2006 | Takeda et al. |
| 7,051,945 B2 | 5/2006 | Empedocles et al. |
| 7,061,014 B2 | 6/2006 | Hosono et al. |
| 7,064,346 B2 | 6/2006 | Kawasaki et al. |
| 7,064,372 B2 | 6/2006 | Duan et al. |
| 7,067,867 B2 | 6/2006 | Duan et al. |
| 7,083,104 B1 | 8/2006 | Empedocles et al. |
| 7,102,605 B2 | 9/2006 | Stumbo et al. |
| 7,105,868 B2 | 9/2006 | Nause et al. |
| 7,135,728 B2 | 11/2006 | Duan et al. |
| 7,172,928 B2 | 2/2007 | Yamazaki |
| 7,211,825 B2 | 5/2007 | Shih et al. |
| 7,233,041 B2 | 6/2007 | Duan et al. |
| 7,262,463 B2 | 8/2007 | Hoffman |
| 7,262,501 B2 | 8/2007 | Duan et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,351,621 B2 | 4/2008 | Moon |
| 7,378,711 B2 | 5/2008 | Suh et al. |
| 7,381,579 B2 | 6/2008 | Suh et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,328 B2 | 9/2008 | Duan et al. |
| 7,435,633 B2 | 10/2008 | Todorokihara et al. |
| 7,439,543 B2 | 10/2008 | Yamazaki |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,528,820 B2 | 5/2009 | Yoon et al. |
| 7,564,055 B2 | 7/2009 | Hoffman |
| 7,579,199 B2 | 8/2009 | Suh et al. |
| 7,615,495 B2 | 11/2009 | Fujikawa et al. |
| 7,619,562 B2 | 11/2009 | Stumbo et al. |
| 7,635,889 B2 | 12/2009 | Isa et al. |
| 7,655,566 B2 | 2/2010 | Fujii |
| 7,671,958 B2 | 3/2010 | Fujita |
| 7,674,650 B2 | 3/2010 | Akimoto et al. |
| 7,679,085 B2 | 3/2010 | Jun et al. |
| 7,687,808 B2 | 3/2010 | Umezaki |
| 7,701,428 B2 | 4/2010 | Stumbo et al. |
| 7,704,859 B2 | 4/2010 | Sato |
| 7,732,330 B2 | 6/2010 | Fujii |
| 7,732,819 B2 | 6/2010 | Akimoto et al. |
| 7,767,106 B2 | 8/2010 | Chang |
| 7,781,964 B2 | 8/2010 | Hara et al. |
| 7,791,074 B2 | 9/2010 | Iwasaki |
| 7,851,841 B2 | 12/2010 | Duan et al. |
| 7,855,152 B2 | 12/2010 | Yanase et al. |
| 7,855,379 B2 | 12/2010 | Hayashi et al. |
| 7,872,259 B2 | 1/2011 | Den et al. |
| 7,893,431 B2 | 2/2011 | Kim et al. |
| 7,932,511 B2 | 4/2011 | Duan et al. |
| 7,935,582 B2 | 5/2011 | Iwasaki |
| 7,956,361 B2 | 6/2011 | Iwasaki |
| 7,978,274 B2 | 7/2011 | Umezaki et al. |
| 8,003,989 B2 | 8/2011 | Nakajima et al. |
| 8,023,055 B2 | 9/2011 | Nakajima et al. |
| 8,030,186 B2 | 10/2011 | Romano et al. |
| 8,049,275 B2 | 11/2011 | Yamazaki |
| 8,054,279 B2 | 11/2011 | Umezaki et al. |
| 8,088,652 B2 | 1/2012 | Hayashi et al. |
| 8,093,589 B2 | 1/2012 | Sugihara et al. |
| 8,129,233 B2 | 3/2012 | Jun et al. |
| 8,143,115 B2 | 3/2012 | Omura et al. |
| 8,143,678 B2 | 3/2012 | Kim et al. |
| 8,148,721 B2 | 4/2012 | Hayashi et al. |
| 8,154,024 B2 | 4/2012 | Iwasaki |
| 8,188,472 B2 | 5/2012 | Park et al. |
| 8,212,252 B2 | 7/2012 | Den et al. |
| 8,232,552 B2 | 7/2012 | Yano et al. |
| 8,241,948 B2 | 8/2012 | Fujii |
| 8,247,965 B2 | 8/2012 | Yamazaki et al. |
| 8,324,018 B2 | 12/2012 | Isa et al. |
| 8,330,492 B2 | 12/2012 | Umezaki |
| 8,344,379 B2 | 1/2013 | Fujikawa et al. |
| 8,415,198 B2 | 4/2013 | Itagaki et al. |
| 8,421,070 B2 | 4/2013 | Kim et al. |
| 8,436,349 B2 | 5/2013 | Sano et al. |
| 8,520,159 B2 | 8/2013 | Umezaki et al. |
| 8,558,227 B2 | 10/2013 | Fujii |
| 8,624,237 B2 | 1/2014 | Yamazaki et al. |
| 8,633,872 B2 | 1/2014 | Osame |
| 8,654,270 B2 | 2/2014 | Nakajima et al. |
| 8,680,532 B2 | 3/2014 | Yamazaki |
| 8,803,768 B2 | 8/2014 | Kimura et al. |
| 8,957,422 B2 | 2/2015 | Yamazaki |
| 9,041,875 B2 | 5/2015 | Nakajima et al. |
| 9,627,460 B2 | 4/2017 | Yamazaki |
| 9,905,699 B2 | 2/2018 | Hayashi et al. |

(56) References Cited

U.S. PATENT DOCUMENTS

| | | |
|---|---|---|
| 10,714,627 B2 | 7/2020 | Hayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017244 A1 | 1/2005 | Hoffman et al. |
| 2005/0017302 A1 | 1/2005 | Hoffman |
| 2005/0039670 A1 | 2/2005 | Hosono et al. |
| 2005/0116630 A1* | 6/2005 | Kim ............... H01L 21/76804 313/506 |
| 2005/0170643 A1 | 8/2005 | Fujii et al. |
| 2005/0199959 A1 | 9/2005 | Chiang et al. |
| 2005/0263765 A1 | 12/2005 | Maekawa |
| 2005/0264514 A1 | 12/2005 | Kim et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118793 A1 | 6/2006 | Yang et al. |
| 2006/0151820 A1 | 7/2006 | Duan et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0237537 A1 | 10/2006 | Empedocles et al. |
| 2006/0237789 A1 | 10/2006 | Ahn et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0205976 A1 | 9/2007 | Takatori et al. |
| 2007/0241333 A1 | 10/2007 | Park et al. |
| 2007/0252147 A1 | 11/2007 | Kim et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0142797 A1 | 6/2008 | Lee et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0098673 A1 | 4/2009 | Yang et al. |
| 2009/0108256 A1 | 4/2009 | Kwak et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2009/0294808 A1* | 12/2009 | Ito ............... H01L 21/67132 257/288 |
| 2009/0315457 A1* | 12/2009 | Furukawa ......... H01L 29/78603 313/504 |
| 2009/0321731 A1 | 12/2009 | Jeong et al. |
| 2010/0025675 A1 | 2/2010 | Yamazaki et al. |
| 2010/0025678 A1 | 2/2010 | Yamazaki et al. |
| 2010/0072468 A1 | 3/2010 | Yamazaki et al. |
| 2010/0127253 A1* | 5/2010 | Inoue ............... H01L 27/1255 257/43 |
| 2010/0133525 A1 | 6/2010 | Arai et al. |
| 2011/0042669 A1 | 2/2011 | Kim et al. |
| 2011/0050733 A1 | 3/2011 | Yano et al. |
| 2011/0101342 A1 | 5/2011 | Kim et al. |
| 2011/0101343 A1 | 5/2011 | Kim et al. |
| 2011/0175090 A1 | 7/2011 | Sugihara et al. |
| 2012/0132908 A1 | 5/2012 | Sugihara et al. |
| 2012/0168750 A1 | 7/2012 | Hayashi et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2014/0346506 A1 | 11/2014 | Kimura et al. |
| 2015/0255562 A1 | 9/2015 | Nakajima et al. |
| 2015/0318405 A1 | 11/2015 | Hayashi et al. |

FOREIGN PATENT DOCUMENTS

| | | |
|---|---|---|
| EP | 1003223 A | 5/2000 |
| EP | 1737044 A | 12/2006 |
| EP | 1777689 A | 4/2007 |
| EP | 1788633 A | 5/2007 |
| EP | 1892561 A | 2/2008 |
| EP | 1918904 A | 5/2008 |
| EP | 1944645 A | 7/2008 |
| EP | 2149910 A | 2/2010 |
| EP | 2149911 A | 2/2010 |
| EP | 2194026 A | 6/2010 |
| EP | 2218681 A | 8/2010 |
| EP | 2226847 A | 9/2010 |
| EP | 2259292 A | 12/2010 |
| EP | 2261174 A | 12/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 06-232129 A | 8/1994 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2001-053283 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-214434 A | 7/2004 |
| JP | 2004-228401 A | 8/2004 |
| JP | 2004-273614 A | 9/2004 |
| JP | 2004-273732 A | 9/2004 |
| JP | 2004-319673 A | 11/2004 |
| JP | 3587537 | 11/2004 |
| JP | 2005-033172 A | 2/2005 |
| JP | 2005-244240 A | 9/2005 |
| JP | 2006-501689 | 1/2006 |
| JP | 2006-186319 A | 7/2006 |
| JP | 2006-237586 A | 9/2006 |
| JP | 2007-043113 A | 2/2007 |
| JP | 2007-059893 A | 3/2007 |
| JP | 2007-073559 A | 3/2007 |
| JP | 2007-073702 A | 3/2007 |
| JP | 2007-096055 A | 4/2007 |
| JP | 2007-096126 A | 4/2007 |
| JP | 2007-103918 A | 4/2007 |
| JP | 2007-115902 A | 5/2007 |
| JP | 2007-123861 A | 5/2007 |
| JP | 2007-140490 A | 6/2007 |
| JP | 2007-250983 A | 9/2007 |
| JP | 2007-281409 A | 10/2007 |
| JP | 2007-298628 A | 11/2007 |
| JP | 2007-299913 A | 11/2007 |
| JP | 2007-310352 A | 11/2007 |
| JP | 2007-316110 A | 12/2007 |
| JP | 2008-042067 A | 2/2008 |
| JP | 2008-052255 A | 3/2008 |
| JP | 2008-053356 A | 3/2008 |
| JP | 2008-065225 A | 3/2008 |
| JP | 2008-077060 A | 4/2008 |
| JP | 2008-134625 A | 6/2008 |
| JP | 2008-199005 A | 8/2008 |
| JP | 2008-216529 A | 9/2008 |
| JP | 2008-235871 A | 10/2008 |
| JP | 2008-243928 A | 10/2008 |
| JP | 2009-533884 | 9/2009 |
| TW | 562983 | 11/2003 |
| TW | 200511589 | 3/2005 |
| TW | 200529446 | 9/2005 |
| TW | 200629563 | 8/2006 |
| TW | 200727331 | 7/2007 |
| TW | 200802885 | 1/2008 |
| TW | 200841475 | 10/2008 |
| TW | I332709 | 11/2010 |
| WO | WO-2004/032190 | 4/2004 |
| WO | WO-2004/032191 | 4/2004 |
| WO | WO-2004/032193 | 4/2004 |
| WO | WO-2004/114391 | 12/2004 |
| WO | WO-2005/016643 | 2/2005 |
| WO | WO-2005/048222 | 5/2005 |
| WO | WO-2005/074038 | 8/2005 |
| WO | WO-2005/088726 | 9/2005 |
| WO | WO-2006/051994 | 5/2006 |
| WO | WO-2007/029844 | 3/2007 |
| WO | WO-2007/032294 | 3/2007 |
| WO | WO-2007/119386 | 10/2007 |
| WO | WO-2007/120010 | 10/2007 |
| WO | WO-2008/023553 | 2/2008 |
| WO | WO-2008/069056 | 6/2008 |
| WO | WO-2008/069255 | 6/2008 |
| WO | WO-2008/082654 | 7/2008 |
| WO | WO-2008/096768 | 8/2008 |
| WO | WO-2008/105347 | 9/2008 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li,C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda,K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5') Flexible Full Color Top Emission AMOLED Display on Plastic Film and

(56) References Cited

OTHER PUBLICATIONS its Bending Properties", SID Digest '09 : SID International Symposium Digest of Technical Papers, May 31, 2009, pp. 983-985.
Sakata.J et al., "Development of 4.0-IN. Amoled Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size Amoled", Am-FPD '08 Digest of Technical Papers, Jul. 2, 2008, pp. 275-278.
Park.S et al., "Challenge to Future Displays: Transparent AmOLED Driven by Peald Grown ZNO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA Amoled Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 578-581.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29,1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198- 200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters) , 2005, vol. 87, pp. 122102-1-122102-3.
Clarks et al., "First Principles Methods Using Castep", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B. (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn-O TFTs", SID Digest '08 : SID International Symposium Digest of Technical Papers, May 20, 2008, vol. 39, pp. 621-624.
Son.K et al., "42.4L: Late-News Paper: 4 Inch QVGA Amoled Driven by The Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No, 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Chinese Office Action (Application No. 200910207022.4) dated Dec. 31, 2012.

Taiwanese Office Action (Application No. 098135085) dated Dec. 31, 2014.

Korean Office Action (Application No. 2009-0096575) dated Oct. 15, 2015.

Taiwanese Office Action (Application No. 104124537) dated Apr. 28, 2017.

Korean Office Action (Application No. 2018-0029204) dated Mar. 28, 2018.

Taiwanese Office Action (Application No. 107105351) dated May 17, 2018.

Taiwanese Office Action (Application No. 107135907) dated Sep. 26, 2019.

Taiwanese Office Action (Application No. 109118443) dated Feb. 8, 2021.

\* cited by examiner

OXIDE SEMICONDUCTOR, THIN FILM TRANSISTOR, AND DISPLAY DEVICE

BACKGROUND OF THE INVENTION

1. Field of the Invention

The present invention relates to an oxide semiconductor, a thin film transistor in which the oxide semiconductor is used, and a display device in which the thin film transistor is used.

2. Description of the Related Art

The most commonly used material for thin film transistor is hydrogenated amorphous silicon (a-Si:H). Hydrogenated amorphous silicon can be deposited as a thin film over a substrate at a temperature of 300° C. or lower. However, a-Si:H has a disadvantage in that it has a mobility (a field effect mobility in the case of a thin film transistor) of only about 1 $cm^2$/V·sec.

A transparent thin-film field-effect transistor is disclosed in which a thin film of a homologous compound $InMO_3(ZnO)_m$ (M is In, Fe, Ga, or Al, and m is an integer number of greater than or equal to 1 and less than 50), as an oxide semiconductor material that can be formed into a thin film like a-Si:H, is used as an active layer (see Patent Document 1).

In addition, a thin film transistor is disclosed in which an amorphous oxide whose electron carrier concentration is less than $10^{18}/cm^3$ is used for a channel layer and which is an oxide that contains In, Ga, and Zn, where the ratio of In atoms to Ga and Zn atoms is 1:1:m (m<6) (see Patent Document 2).

[Patent Document 1]
Japanese Published Patent Application No. 2004-103957
[Patent Document 2]
PCT International Publication No. 05/088726

SUMMARY OF THE INVENTION

Nevertheless, so far an on-off ratio of about $10^3$ only has been obtained with a conventional thin film transistor in which an oxide semiconductor is used. In other words, even if a thin film transistor having a predetermined on current is obtained, it cannot be considered of normally-off type because the off current is too high. Therefore, the thin film transistor is not yet at the level of practical application. Such an on-off ratio of about $10^3$ is at a level that can be easily achieved with a conventional thin film transistor in which amorphous silicon is used.

It is an object of the present invention to increase field effect mobility of a thin film transistor in which a metal oxide is used and to reduce an off current to obtain a sufficient on-off ratio.

According to an embodiment that is given as an example, an oxide semiconductor contains In, Ga, and Zn as components and has a composition in which the concentration of Zn is lower than the concentrations of In and Ga. The oxide semiconductor preferably has an amorphous structure.

According to an embodiment that is given as an example, an oxide semiconductor is represented by $InMO_3(ZnO)_m$ (M is one or a plurality of elements selected from Ga, Fe, Ni, Mn, Co, and Al, and m is a non-integer number of greater than 0 and less than 1) and has a composition in which the concentration of Zn is lower than the concentrations of In and M (M is one or a plurality of elements selected from Ga, Fe, Ni, Mn, Co, and Al). The oxide semiconductor preferably has an amorphous structure.

Here, m is preferably a non-integer number of greater than 0 or equal to 1 and less than 1.

According to an embodiment that is given as an example, in a thin film transistor, a layer of any of the oxide semiconductors according to the above embodiments is used as a channel formation region. An oxide insulating layer is preferably provided in contact with the oxide semiconductor layer. It is more preferable that the oxide insulating layer be provided over and under the oxide semiconductor layer. A nitride insulating layer is preferably provided outside of the oxide semiconductor layer.

According to an embodiment that is given as an example, in a display device, any of the thin film transistors of the above embodiments is provided for at least one pixel.

According to an embodiment that is given as an example, in a display device, the thin film transistors of any of the above embodiments are provided for at least one pixel and a driver circuit for controlling a signal to be transmitted to the thin film transistor provided in the pixel.

Of In, Ga, and Zn that are contained as components of the oxide semiconductor, the concentration of Zn is set lower than the concentrations of In and Ga, whereby the carrier concentration can be decreased and, furthermore, the oxide semiconductor can have an amorphous structure.

Such an oxide semiconductor layer is used as a channel formation region, whereby the off current of the thin film transistor can be reduced and the on-off ratio thereof can be increased.

DETAILED DESCRIPTION OF THE INVENTION

Figure 1A:
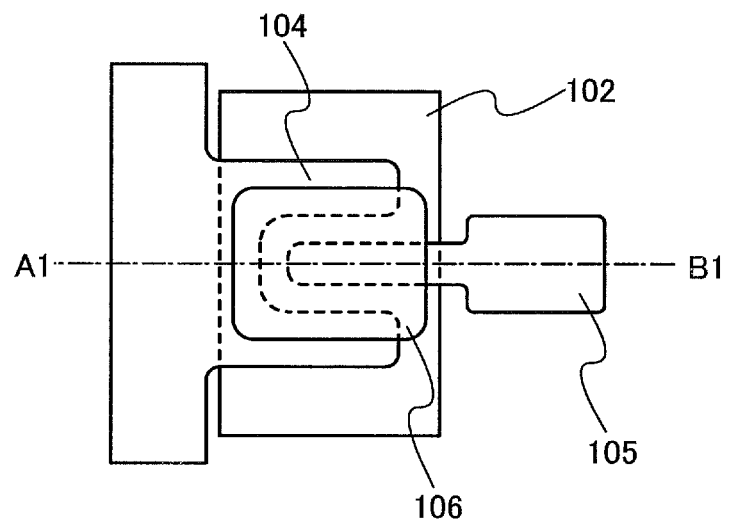
FIG. 1A is a plan view illustrating a structure of a TFT with an oxide semiconductor layer and FIG. 1B is a cross-sectional view illustrating the same.

Hereinafter, Embodiment of the present invention will be described with reference to the accompanying drawings. Note that it is easily understood by those skilled in the art that the present invention can be carried out in many different modes, and the modes and details disclosed herein can be modified in various ways without departing from the spirit and scope of the present invention. Therefore, the present invention should not be construed as being limited to the description below of Embodiment.
(Oxide Semiconductor Material)

An oxide semiconductor material according to this embodiment contains In, Ga, and Zn as components and has a composition in which the concentration of Zn is lower than the concentrations of In and Ga. For example, an oxide semiconductor material according to this embodiment is an oxide semiconductor material that is represented by $InMO_3(ZnO)_m$ and has a composition in which the concentration of Zn is lower than the concentrations of In and M (M is one or a plurality of elements selected from Ga, Fe, Ni, Mn, Co, and Al). Moreover, in the said oxide semiconductor, in some cases, a transition metal element such as Fe or Ni or an oxide of the transition metal is contained as an impurity element in addition to a metal element M.

In the above oxide semiconductor represented by $InMO_3(ZnO)_m$ (M is one or a plurality of elements selected from Ga, Fe, Ni, Mn, Co, and Al, and m is a non-integer number of greater than 0 and less than 1), m represents a non-integer number of greater than 0 and less than 1. An oxide semiconductor whose composition in a crystal state is represented by $InGaO_3(ZnO)_m$, where m is an integer number of greater than or equal to 1 and less than 50, is known. However, in consideration of control during manufacture, a composition of $InMO_3(ZnO)_m$, where m is a non-integer number, is preferable, in which case control is easily performed. In addition, m is preferably a non-integer number so that an amorphous structure of the oxide semiconductor material is maintained stably.

Here, m is preferably a non-integer number of greater than 0 and less than 1.

In the oxide semiconductor that is represented by $InMO_3(ZnO)_m$ (M is one or a plurality of elements selected from Ga, Fe, Ni, Mn, Co, and Al, and m is a non-integer number of greater than 0 and less than 1), the following composition is preferable: In is contained at a concentration of less than 20 atomic %, M (e.g., Ga) is contained at a concentration of less than 20 atomic %, and Zn is contained at a concentration of less than 10 atomic % when the total of the concentrations of In, M, Zn, and O is defined as 100%. A more preferable composition of the oxide semiconductor material that contains In, Ga as M, and Zn is as follows: In and Ga are each contained at a concentration of greater than or equal to 15.0 atomic % and less than or equal to 20.0 atomic %, and Zn is contained at a concentration of greater than or equal to 5.0 atomic % and less than or equal to 10.0 atomic %.

The oxide semiconductor has an amorphous structure, and it is not crystallized even by heat treatment at 500° C. in a nitrogen atmosphere. When the temperature of the heat treatment is increased to 700° C., nanocrystals are generated in the amorphous structure in some cases. In either case, the oxide semiconductor is a non-single-crystal semiconductor.

The concentration of Zn is made to be lower than the concentrations of In and Ga so that the oxide semiconductor has an amorphous structure. In the oxide semiconductor, the concentration of Zn is preferably less than or equal to the half of each of the concentrations of In and Ga. In the case where the proportion of Zn or ZnO in the oxide semiconductor is high, a film formed by a sputtering method is a crystallized film. In addition, in the case where the proportion of Zn or ZnO in the oxide semiconductor is high, even if the oxide semiconductor is amorphous in the initial state, it is easily crystallized by heat treatment at several hundred degrees Celsius. On the other hand, when the concentration of Zn is made to be lower than the concentrations of In and Ga, the range of composition by which an amorphous structure is obtained in the oxide semiconductor can be expanded.
(Method for Forming Oxide Semiconductor Film)

An oxide semiconductor film is preferably formed by a physical vapor deposition (PVD) method. Although a sputtering method, a resistance heating evaporation method, an electron beam evaporation method, an ion beam deposition method, or the like can be employed as a PVD method for forming the oxide semiconductor film, the sputtering method is preferably employed so that deposition of the oxide semiconductor film over a large substrate can be easily performed.

As a preferable deposition method, a reactive sputtering method can be employed in which metal targets made of In, M (M is one or a plurality of elements selected from Ga, Fe, Ni, Mn, Co, and Al), Zn, and the like are used and reacted with oxygen to deposit an oxide semiconductor film over a substrate. As another deposition method, a sputtering method can be employed in which a target made by sintering oxides of In, M (M is one or a plurality of elements selected from Ga, Fe, Ni, Mn, Co, and Al), and Zn is used. Further, as another deposition method, a reactive sputtering method can be employed in which a target made by sintering oxides of In, M (M is one or a plurality of elements selected from Ga, Fe, Ni, Mn, Co, and Al), and Zn is used and the target is reacted to deposit an oxide semiconductor film over a substrate.

As an example of a target used in the sputtering method, a sintered body of $In_2O_3$, $Ga_2O_3$, and ZnO can be employed. The proportions of elements of such a target are preferably set as follows: the proportions of $In_2O_3$, $Ga_2O_3$, and ZnO are set to the same value, or the proportion of ZnO is smaller than the proportions of $In_2O_3$ and $Ga_2O_3$. Although the composition of the oxide semiconductor film deposited over the substrate is changed depending on a sputtering rate of a target material to a sputtering gas, the use of at least the above composition of the target makes it possible to obtain an oxide semiconductor film in which In, Ga, and Zn are contained as components and the concentration of Zn is lower than the concentrations of In and Ga.

Sputtering is performed in such a manner that DC power is applied to the above target to generate plasma in a deposition chamber. Use of a pulsed DC power source is preferable, in which case dust can be reduced and film thickness distribution can be uniform.

Of In, Ga, and Zn that are contained as components of the oxide semiconductor, the concentration of Zn is set lower than the concentrations of In and Ga, whereby the carrier concentration can be decreased and the oxide semiconductor can have an amorphous structure.

(Thin Film Transistor)

As a substrate for manufacturing a thin film transistor using an oxide semiconductor film for a channel formation region, a glass substrate, a plastic substrate, a plastic film, or the like can be used. As the glass substrate, a glass substrate of barium borosilicate glass, aluminoborosilicate glass, aluminosilicate glass, or the like can be used. For example, a glass substrate containing barium oxide (BaO) at a higher composition ratio than that of boric oxide ($B_2O_3$) and having a strain point of 730° C. or higher is preferably used. The oxide semiconductor film can be formed at 200° C. or lower by a sputtering method, and a substrate made of a plastic material typified by polyethylene terephthalate (PET), polyethylene naphthalate (PEN), polyethersulfone (PES), or polyimide, a plastic film of the above plastic material which has a thickness of 200 μm or less can be used.

Figure 1B:
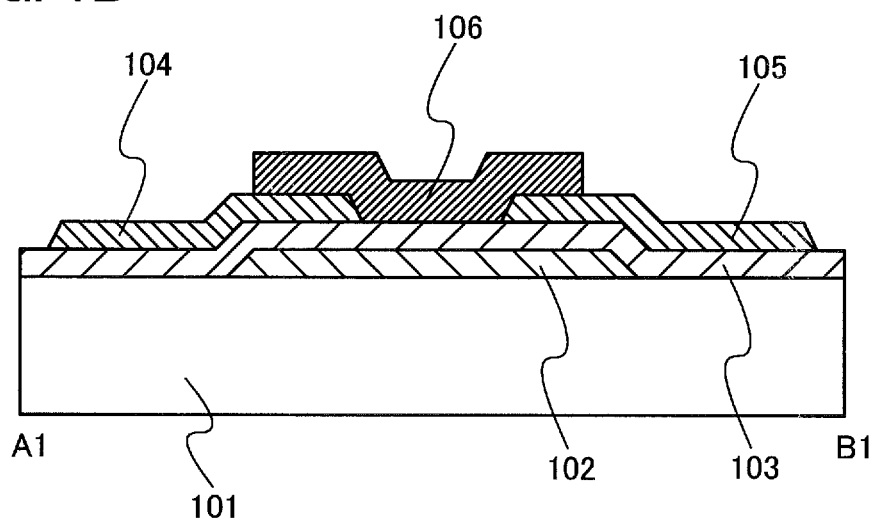

FIGS. 1A and 1B illustrate an example of a thin film transistor manufactured over a surface of a substrate 101. FIG. 1A is a plan view of a thin film transistor, and FIG. 1B is a cross-sectional view taken along a line A1-B1.

The thin film transistor illustrated in FIGS. 1A and 1B has a bottom gate structure in which a gate electrode 102 and a gate insulating layer 103 are sequentially formed over the substrate 101 and an oxide semiconductor layer 106 is formed over the gate insulating layer 103. A source electrode 104 and a drain electrode 105 are provided between the gate insulating layer 103 and the oxide semiconductor layer 106. In other words, the oxide semiconductor layer 106 is provided to overlap the gate electrode 102 and to be in contact with part of an upper portion of the gate insulating layer 103 and part of a side portion and an upper portion of the source electrode 104 and the drain electrode 105. A structure in which the source electrode 104 and the drain electrode 105 are provided over the gate insulating layer 103 before the oxide semiconductor layer 106 is advantageous in that a base surface can be cleaned by plasma treatment before forming the oxide semiconductor layer 106 thereover.

The gate electrode 102 is preferably formed of a refractory metal such as Ti, Mo, Cr, Ta, or W. Alternatively, the gate electrode 102 may have a structure in which a layer of a refractory metal typified by Mo, Cr, or Ti is provided either over an Al film or over an Al film to which Si, Ti, Nd, Sc, Cu, or the like is added.

The gate insulating layer 103 is preferably formed of oxide or nitride of silicon, such as silicon oxide, silicon nitride, or silicon oxynitride. In particular, when the gate insulating layer 103 is formed of silicon oxide, the leakage current between the source electrode and the gate electrode and between the drain electrode and the gate electrode can be as low as about $10^{-10}$ A, or less. These insulating layers can be formed by a plasma CVD method, a sputtering method, or the like.

For example, as the gate insulating layer 103, a silicon oxide layer can be formed by a CVD method using an organosilane gas. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The source electrode 104 and the drain electrode 105 are preferably formed of a refractory metal such as Ti, Mo, Cr, Ta, or W. In particular, a metal material having high affinity for oxygen, typified by Ti, is preferably used. This is because such a metal material easily makes an ohmic contact with the oxide semiconductor layer 106. Other than Ti, Mo can also be used to obtain a similar effect. The source electrode 104 and the drain electrode 105 are preferably processed by etching to have a tapered end shape. In this manner, their contact areas with the oxide semiconductor layer 106 can be increased. Between the source and drain electrodes 104 and 105 and the oxide semiconductor film, an oxide semiconductor film having an oxygen-deficient defect (an oxide semiconductor film having a lower resistance than the oxide semiconductor film which is used for a channel formation region) may be provided.

As another mode of the source electrode 104 and the drain electrode 105, the electrodes may have a structure in which a layer of a refractory metal typified by Mo, Cr, or Ti is provided over and/or under an Al film or an Al film to which Si, Ti, Nd, Sc, Cu, or the like is added. This structure is advantageous when a wiring for transmitting signals is formed at the same time and with the same layer as a layer for forming the source electrode 104 and the drain electrode 105. The layer of a refractory metal provided in contact with the Al film is preferably provided in order to prevent hillocks or whiskers from being formed on the Al film. Note that the term "hillock" refers to a phenomenon in which as crystal growth of Al proceeds, growing components impinge on each other to form a bump. The term "whisker" refers to a phenomenon in which Al grows into a needle-like shape due to abnormal growth.

The oxide semiconductor layer 106 is formed by a PVD method typified by a sputtering method. As a sputtering target, a sintered body of oxides of In, M (M is one or a plurality of elements selected from Ga, Fe, Ni, Mn, Co, and Al), and Zn is preferably used as described above. For example, the oxide semiconductor film is formed by a sputtering method using a sintered body of $In_2O_3$, $Ga_2O_3$, and ZnO as a target.

As a sputtering gas, a rare gas typified by argon is used. In order to control the oxygen-deficient defect of the oxide semiconductor film, a predetermined amount of an oxygen gas may be added to a rare gas. By increasing the ratio of an oxygen gas to a rare gas in a sputtering gas, the oxygen-deficient defect in an oxide semiconductor can be reduced. The control of the oxygen-deficient defect in an oxide semiconductor makes it possible to control the threshold voltage of a thin film transistor.

Before the oxide semiconductor layer 106 is formed, it is preferable to perform treatment for cleaning a deposition surface by introducing an argon gas into a deposition chamber of a sputtering apparatus and generating plasma. Instead of an argon atmosphere, nitrogen, helium, or the like may be used. Alternatively, the treatment may be performed in an atmosphere obtained by adding oxygen, $N_2O$, or the like to an argon atmosphere. Still alternatively, the treatment may be performed in an atmosphere obtained by adding $Cl_2$, $CF_4$, or the like to an argon atmosphere.

After the oxide semiconductor layer 106 is formed, heat treatment at 200° C. to 600° C., preferably 300° C. to 400° C., is performed in air or in a nitrogen atmosphere. Through this heat treatment, the field-effect mobility of a thin film transistor can be increased. The field-effect mobility of the thin film transistor with the oxide semiconductor described in this embodiment can be as high as 5 cm$^2$/Vsec, or more.

When a voltage of about 5 V is applied between a source electrode and a drain electrode of such a thin film transistor as described above and when no voltage is applied to a gate electrode, the current flowing between the source electrode and the drain electrode can be as low as $1\times10^{-11}$ A, or less. Even in a state where a voltage of −10 V is applied to the gate electrode, the current flowing between the source electrode and the drain electrode is $1\times10^{-11}$ A, or less.

Figure 2A:
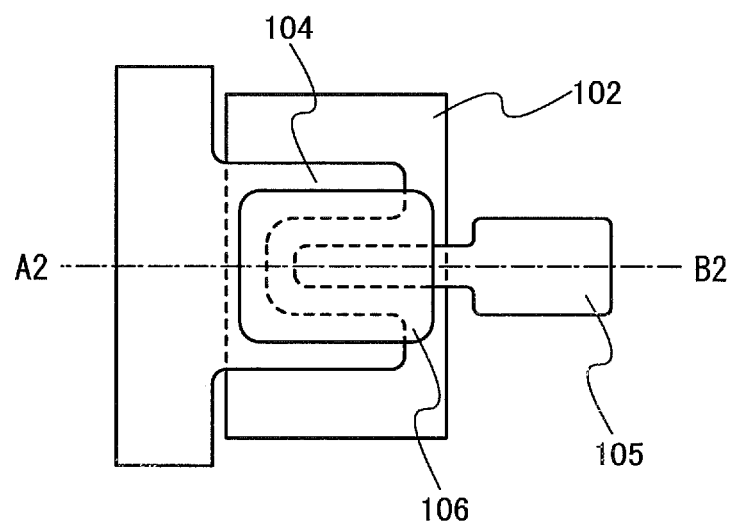
FIG. 2A is a plan view illustrating a structure of a TFT with an oxide semiconductor layer and FIG. 2B is a cross-sectional view illustrating the same.
Figure 2B:
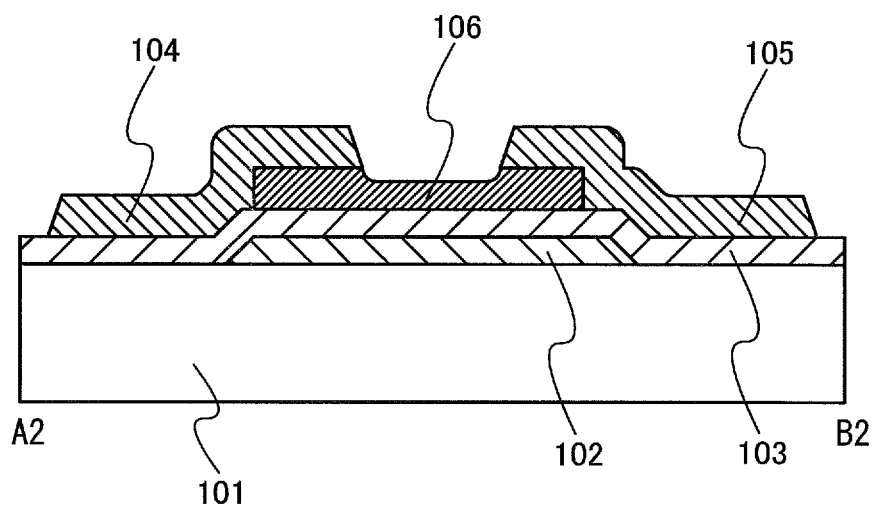

FIGS. 2A and 2B illustrate an example of a thin film transistor manufactured over a surface of a substrate 101. FIG. 2A is a plan view of a thin film transistor, and FIG. 2B is a cross-sectional view taken along a line A2-B2.

The thin film transistor illustrated in FIGS. 2A and 2B has a bottom gate structure in which a gate electrode 102 and a gate insulating layer 103 are sequentially formed over the substrate 101 and an oxide semiconductor layer 106 is formed over the gate insulating layer 103. In this structure, a source electrode 104 and a drain electrode 105 are in contact with a side surface and an upper surface of the oxide semiconductor layer 106.

In the thin film transistor having such a structure, the gate insulating layer 103, the oxide semiconductor layer 106, and a conductive layer for forming the source electrode 104 and the drain electrode 105 can be formed successively. In other words, these layers can be stacked without exposing the interface between the gate insulating layer 103 and the oxide semiconductor layer 106 and the interface between the oxide semiconductor layer 106 and the conductive layer to air; thus, each interface can be prevented from being contaminated.

Further, the off current can be reduced by performing etching to remove a superficial portion of the oxide semiconductor layer 106 which is exposed between the source electrode 104 and the drain electrode 105. Furthermore, by performing oxygen plasma treatment on the exposed portion of the oxide semiconductor layer 106 or the surface obtained by etching removal, the resistance of the superficial portion exposed to plasma can be increased. This is because the oxygen-deficient defect in the oxide semiconductor is oxidized and thus the carrier concentration (electron concentration) is decreased. By this oxygen plasma treatment, the off current of the thin film transistor can be reduced.

Figure 3A:
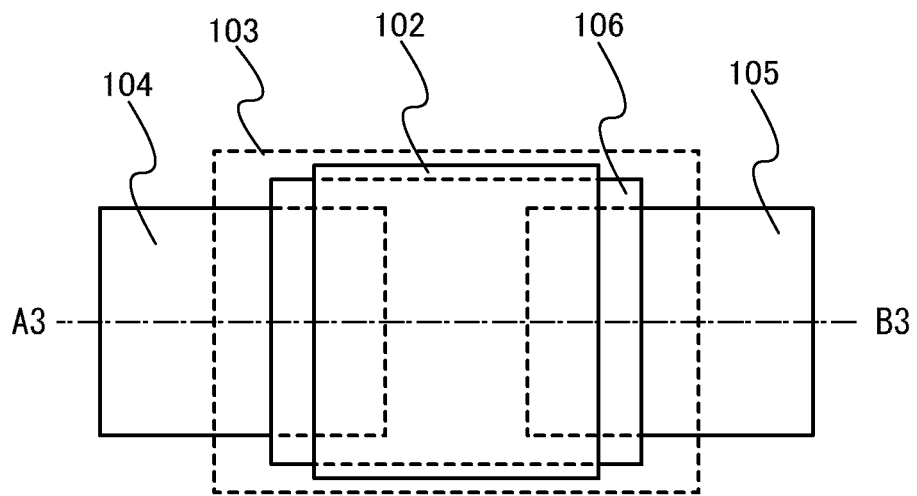
FIG. 3A is a plan view illustrating a structure of a TFT with an oxide semiconductor layer and FIG. 3B is a cross-sectional view illustrating the same.
Figure 3B:
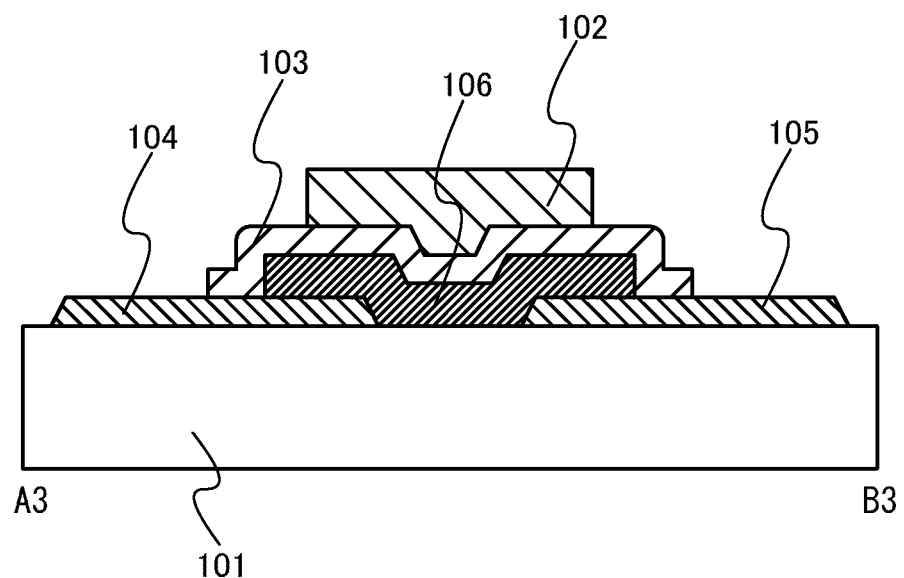

FIGS. 3A and 3B illustrate an example of a thin film transistor manufactured over a surface of a substrate 101. FIG. 3A is an example of a plan view of a thin film transistor, and FIG. 3B is a cross-sectional view taken along a line A3-B3.

The thin film transistor illustrated in FIGS. 3A and 3B has a top gate structure in which a source electrode 104 and a drain electrode 105, an oxide semiconductor layer 106, a gate insulating layer 103, and a gate electrode 102 are sequentially formed over the substrate 101. The off current of the thin film transistor can be reduced and the on-off ratio thereof can be increased in the case where the oxide semiconductor layer 106 of the previously described thin film transistor is formed with an oxide semiconductor material that is represented by InMO$_3$(ZnO)$_m$ (M is one or a plurality of elements selected from Ga, Fe, Ni, Mn, Co, and Al, and m is a non-integer number of greater than 0 and less than 1) and has the following composition: In is contained at a concentration of less than 20 atomic %, M (e.g., Ga) is contained at a concentration of less than 20 atomic %, and Zn is contained at a concentration of less than 10 atomic % when the total of the concentrations of In, M, Zn, and O is defined as 100%.

Figure 4A:
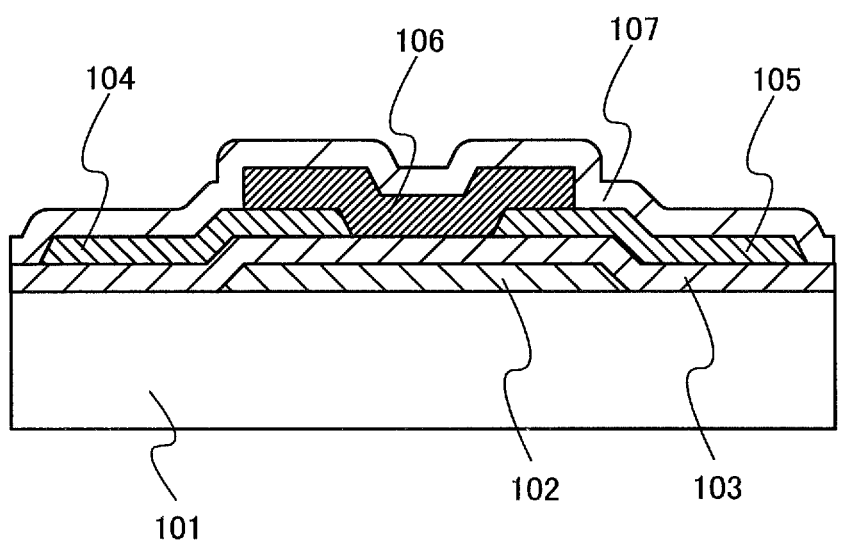
FIGS. 4A and 4B are cross-sectional views illustrating a structure of a TFT with an oxide semiconductor layer.

FIG. 4A illustrates an example in which an oxide insulating layer 107 is provided over the oxide semiconductor layer 106, which is opposite to the gate insulating layer 103 (on a back channel side). For the oxide insulating layer 107, any one of aluminum oxide, aluminum oxynitride, yttrium oxide, or hafnium oxide, as well as silicon oxide mentioned above, can be used. With the structure of FIG. 4A, in which the oxide semiconductor layer 106 is sandwiched between a gate insulating layer 103 comprising silicon oxide and the oxide insulating layer 107, the formation of an oxygen-deficient defect due to the release of oxygen from the oxide semiconductor layer 106 can be prevented.

Figure 4B:
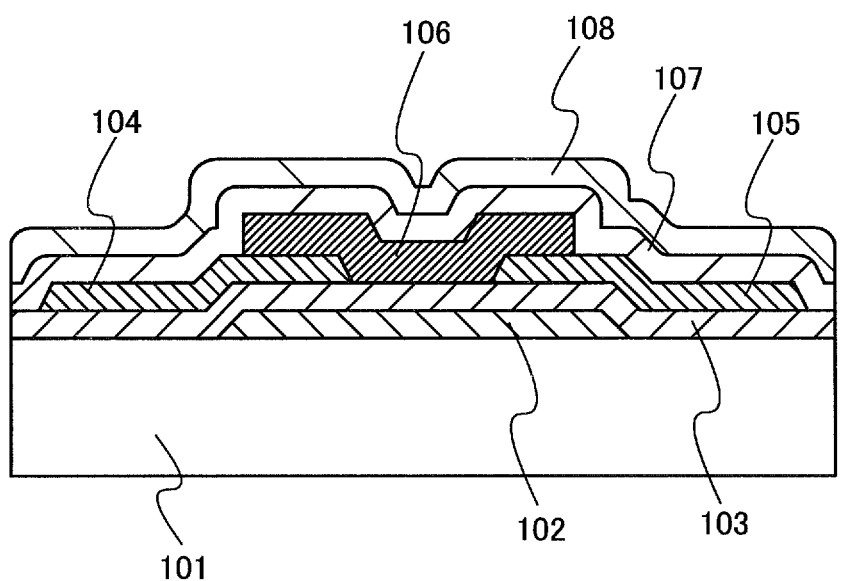

FIG. 4B illustrates a structure in which a nitride insulating layer 108 is provided over the oxide insulating layer 107. For the nitride insulating layer 108, silicon nitride, aluminum nitride, or the like can be used. With the nitride insulating layer 108, contamination by water vapor, an organic substance, and ionic metal from the external environment can be prevented. Note that in the structure of FIG. 4B, the gate insulating layer 103 having a two-layer structure of a silicon nitride layer and a silicon oxide layer is also effective. In that case, the oxide semiconductor layer 106 is sandwiched between upper oxide and nitride insulating layers and lower oxide and nitride insulating layers; thus, the above-described effect can be further enhanced.

(Device Including Thin Film Transistor)

A thin film transistor with the oxide semiconductor described in this embodiment can be used for a variety of applications because of its high field-effect mobility and high on-off ratio. A mode of a display device will be described as an example.

Figure 5:
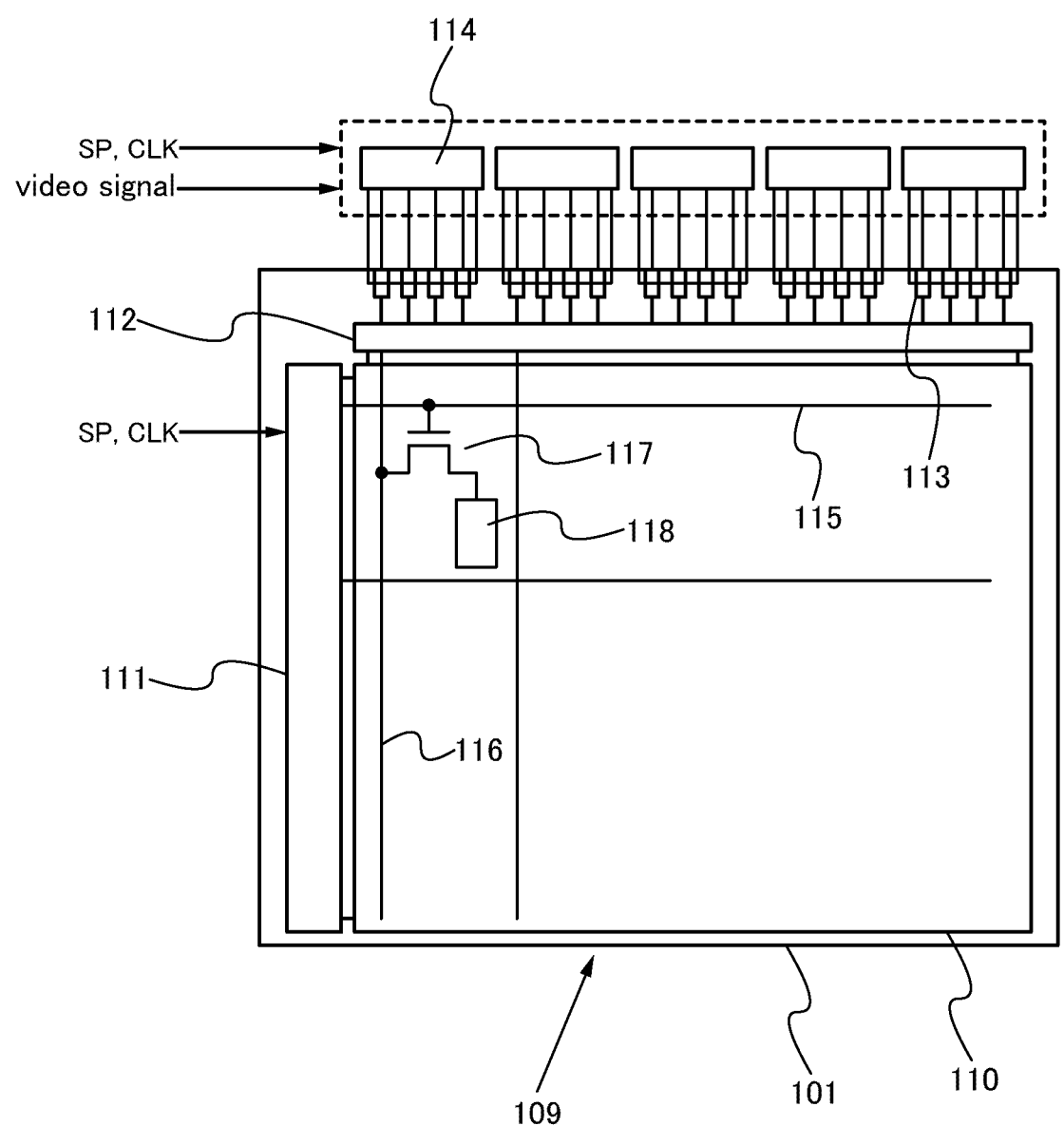
FIG. 5 is a diagram illustrating one mode of a display device including a TFT with an oxide semiconductor layer.

FIG. 5 illustrates a display device 109 in which a pixel portion 110, a scan line driver circuit 111, and a selector circuit 112 on a signal line side are provided over a substrate 101. Switching elements provided in the pixel portion 110, the scan line driver circuit 111, and the selector circuit 112 on the signal line side include thin film transistors whose channel formation regions are each formed in an oxide semiconductor layer. With the use of a thin film transistor whose channel formation region is formed in an oxide semiconductor layer and whose field-effect mobility is 5 cm$^2$/V·sec to 20 cm$^2$/V·sec, the scan line driver circuit 111 and the selector circuit 112 on the signal line side can be formed. The selector circuit 112 is a circuit which selects signal lines 116 and assigns a video signal transmitted from a driver IC 114 to a predetermined signal line 116 at a predetermined timing In this example, the thin film transistor is of an n-channel type, and thus the scan line driver circuit 111 and the selector circuit 112 on the signal line side include n-channel thin film transistors.

In the pixel portion 110 including a plurality of scan lines 115 and a plurality of signals lines 116 which intersect with the scan lines 115, pixel transistors 117 are provided. The pixel transistors 117 are arranged in matrix. To the pixel transistors 117, scan signals are input through the scan lines 115 and video signals are input through the signal lines 116. Video signals are input to input terminals 113 from the driver IC 114. The driver IC 114 is formed on a single crystal substrate and mounted by a tape-automated bonding (TAB) method or a chip-on-glass (COG) method.

Figure 6:
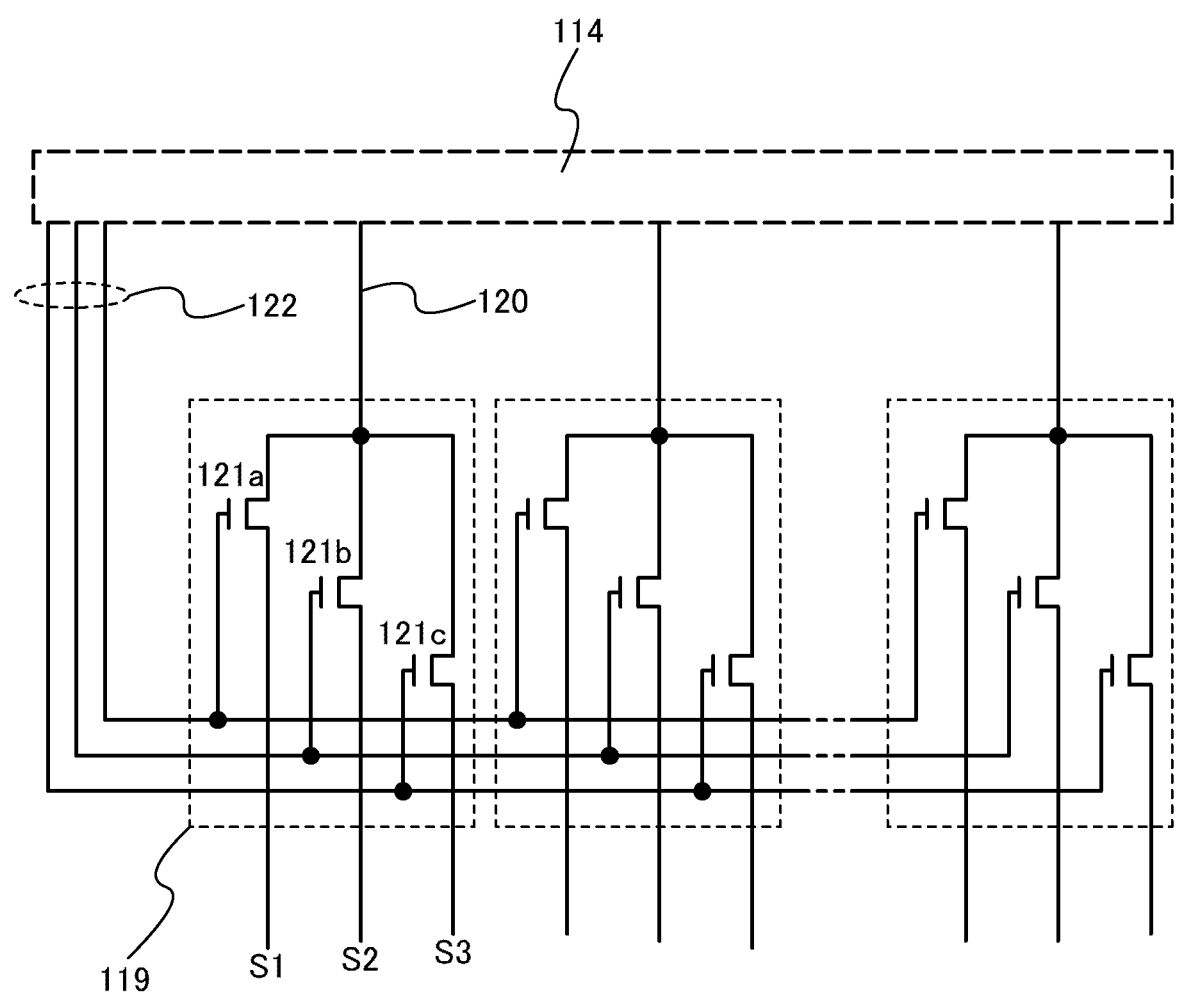
FIG. 6 is a circuit diagram illustrating a structure of a selector circuit including a TFT with an oxide semiconductor layer.

FIG. 6 illustrates an example of a structure of the selector circuit 112 including n-channel thin film transistors. The selector circuit 112 includes a plurality of arranged switch circuits 119. In each switch circuit 119, one video signal input line 120 is provided with a plurality of signal lines 116 (S1 to S3) extending to the pixel portion 110. The switch circuit 119 is provided with switching elements 121, the number of which corresponds to the number of the signal lines 116. When these switching elements 121 include thin film transistors whose channel formation regions are each formed in an oxide semiconductor layer, the switch circuit 119 can operate at high speed in accordance with frequencies of video signals. FIG. 6 illustrates an example of the switch circuit 119 in which the signal line 116 (S1), the signal line 116 (S2), and the signal line 116 (S3) are provided with a switching element 121a, a switching element 121b, and a switching element 121c, respectively. The determination of whether to turn the switching element 121 on or off is controlled with a signal which is input through a synchronization signal input line 122 that is a different route from the video signal input line 120.

Figure 7:
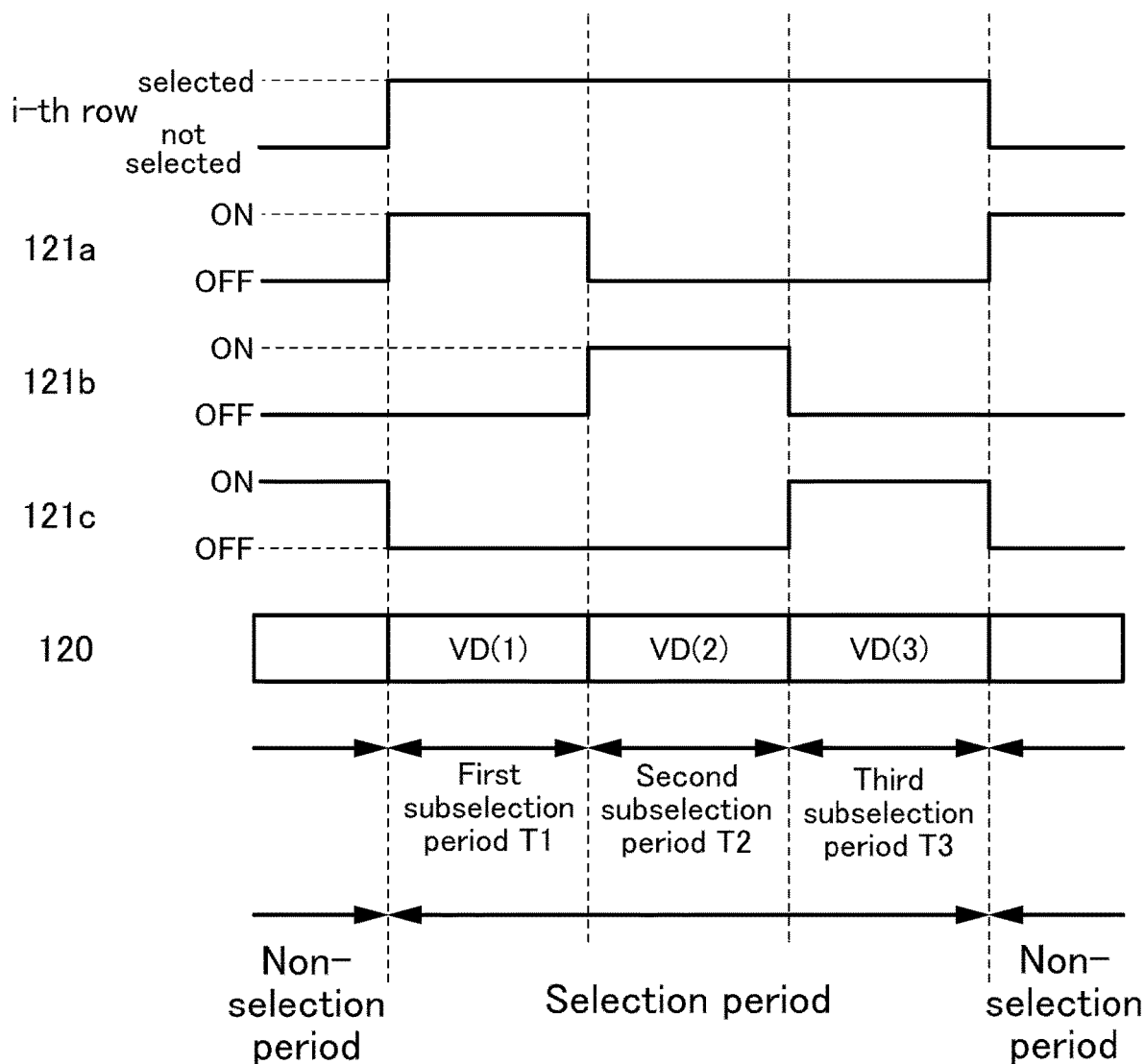
FIG. 7 is a timing chart illustrating an example of operation of a selector circuit.

The operation of the selector circuit 112 illustrated in FIG. 6 will be described with reference to a timing chart illustrated in FIG. 7. The timing chart in FIG. 7 illustrates, as an example, the case where a scan line of the i-th row is selected and a video signal input line 120 of a given column is connected to the selector circuit 112. A selection period of the scan line of the i-th row is divided into a first sub-selection period T1, a second sub-selection period T2, and a third sub-selection period T3. This timing chart also illustrates timings at which the switching element 121a, the switching element 121b, and the switching element 121c are turned on or off and signals which are input to the video signal input line 120.

As illustrated in FIG. 7, in a first sub-selection period T1, the switching element 121a is turned on and the switching element 121b and the switching element 121c are turned off. At this time, a video signal VD(1) input to the video signal input line 120 is output to the signal line 116 (S1) via the switching element 121a. In a second sub-selection period T2, the switching element 121b is turned on and the switching element 121a and the switching element 121c are turned off, and a video signal VD(2) is output to the signal line 116 (S2) via the switching element 121b. In a third sub-selection period T3, the switching element 121c is turned on and the switching element 121a and the switching element 121b are turned off, and a video signal VD(3) is output to the signal line 116 (S3) via the switching element 121c.

By dividing one gate selection period into three as described above, the selector circuit 112 of FIG. 6 can input video signals to three signal lines 116 (S1 to S3) through one video signal input line 120 during one gate selection period. Thus, when the selector circuit 112 is provided over the substrate 101 together with the pixel transistors 117, the number of input terminals 113 to which signals of the driver IC are input can be reduced to ⅓ of that in the case where the selector circuit 112 is not provided. Accordingly, the possibility of generation of a contact defect between the driver IC and the input terminals 113 can be reduced.

The scan line driver circuit 111 can also be formed with thin film transistors whose channel formation regions are each provided in an oxide semiconductor layer. The scan line driver circuit 111 includes a shift register as a component. When a clock signal (CLK) and a start pulse signal (SP) are input to the shift register, a selection signal is generated. The generated selection signal is buffered and amplified by a buffer, and the resulting signal is supplied to a corresponding scan line 115. Gate electrodes of pixel transistors 117 of one line are connected to each scan line 115. A mode of a shift register 123 included in part of the scan line driver circuit 111 will be described here with reference to FIG. 8 and FIG. 9.

Figure 8:
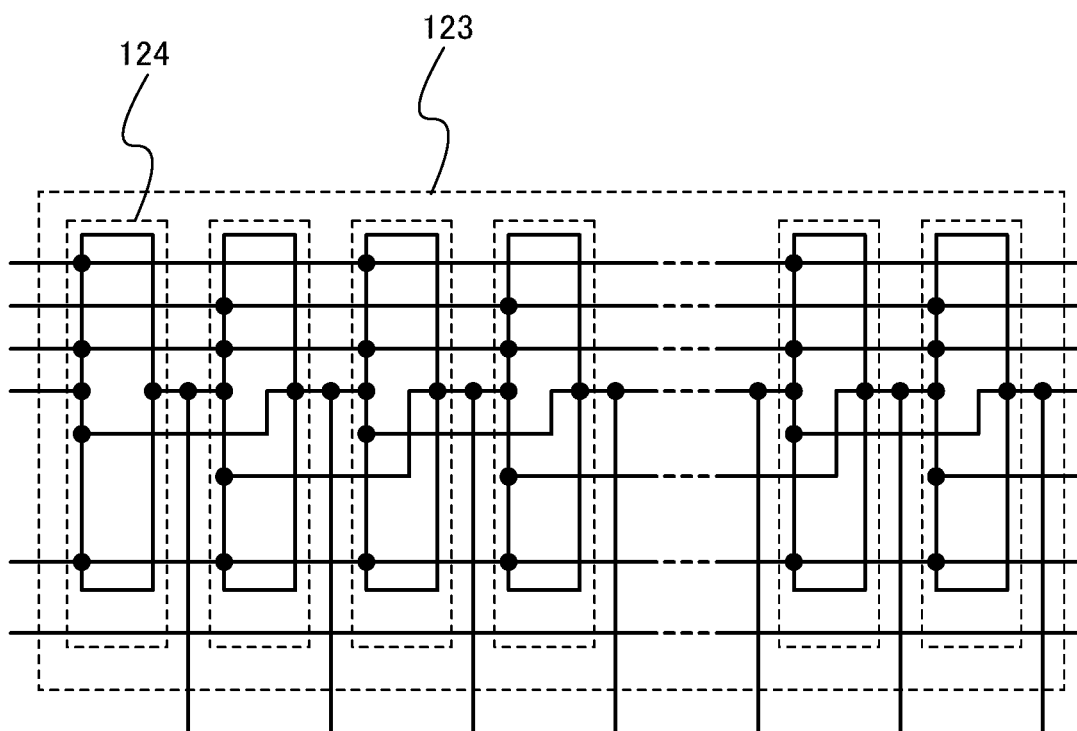
FIG. 8 is a block diagram illustrating a shift register including a TFT with an oxide semiconductor layer.
Figure 9:
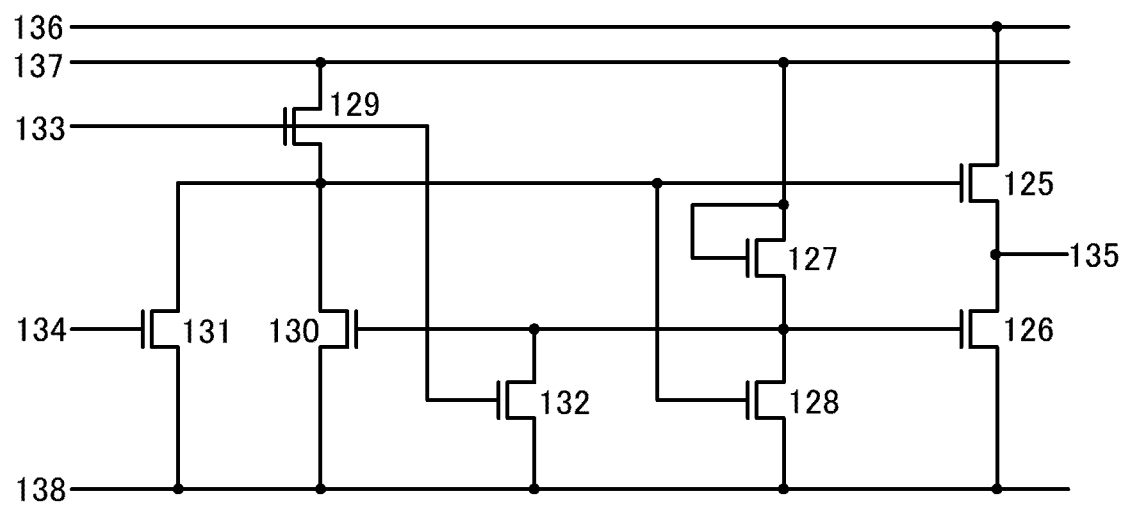
FIG. 9 is a circuit diagram illustrating a flip-flop circuit including a TFT with an oxide semiconductor layer.

FIG. 8 illustrates a structure of the shift register 123. The shift register 123 includes plural stages of flip-flop circuits 124 which are connected. An example of the flip-flop circuit 124 is illustrated in FIG. 9. The flip-flop circuit 124 illustrated in FIG. 9 includes a plurality of thin film transistors (hereinafter referred to as "TFTs" in the description of FIG. 9). The flip-flop circuit 124 illustrated in FIG. 9 includes n-channel TFTs which are a TFT (1) 125, a TFT (2) 126, a TFT (3) 127, a TFT (4) 128, a TFT (5) 129, a TFT (6) 130, a TFT (7) 131, and a TFT (8) 132. An n-channel TFT is turned on when the gate-source voltage (Vgs) exceeds the threshold voltage (Vth).

Although the case where all TFTs included in the flip-flop circuit 124 illustrated in FIG. 9 are enhancement-mode n-channel transistors is described, the driver circuit can also be driven if a depletion-mode n-channel transistor is used as the TFT (3) 127, for example.

A first electrode (one of a source electrode and a drain electrode) of the TFT (1) 125 is connected to a wiring (4) 136, and a second electrode (the other of the source electrode and the drain electrode) of the TFT (1) 125 is connected to a wiring (3) 135.

A first electrode of the TFT (2) 126 is connected to a wiring (6) 138, and a second electrode of the TFT (2) 126 is connected to the wiring (3) 135.

A first electrode of the TFT (3) 127 is connected to a wiring (5) 137; a second electrode of the TFT (3) 127 is connected to a gate electrode of the TFT (2) 126; and a gate electrode of the TFT (3) 127 is connected to the wiring (5) 137.

A first electrode of the TFT (4) 128 is connected to the wiring (6) 138; a second electrode of the TFT (4) 128 is connected to the gate electrode of the TFT (2) 126; and a gate electrode of the TFT (4) 128 is connected to a gate electrode of the TFT (1) 125.

A first electrode of the TFT (5) 129 is connected to the wiring (5) 137; a second electrode of the TFT (5) 129 is connected to the gate electrode of the TFT (1) 125; and a gate electrode of the TFT (5) 129 is connected to a wiring (1) 133.

A first electrode of the TFT (6) 130 is connected to the wiring (6) 138; a second electrode of the TFT (6) 130 is connected to the gate electrode of the TFT (1) 125; and a gate electrode of the TFT (6) 130 is connected to the gate electrode of the TFT (2) 126.

A first electrode of the TFT (7) 131 is connected to the wiring (6) 138; a second electrode of the TFT (7) 131 is connected to the gate electrode of the TFT (1) 125; and a gate electrode of the TFT (7) 131 is connected to a wiring (2) 134. A first electrode of the TFT (8) 132 is connected to the wiring (6) 138; a second electrode of the TFT (8) 132 is connected to the gate electrode of the TFT (2) 126; and a gate electrode of the TFT (8) 132 is connected to the wiring (1) 133.

A thin film transistor whose channel formation region is provided in an oxide semiconductor layer has high field-effect mobility and thus its operation frequency can be set high. In addition, because the frequency characteristics of the thin film transistor are high, the scan line driver circuit 111 can operate at high speed, and a display device can operate with high frame frequency.

In FIG. 5, the structure of the pixel portion 110 varies with a display medium 118. When the display medium 118 is a liquid crystal element in which a liquid crystal material is interposed between electrodes, the display medium 118 can be controlled by the pixel transistor 117 as illustrated in FIG. 5. The same applies to the case of a display medium 118 in which a contrast medium (electronic ink or an electrophoretic material) is interposed between a pair of electrodes.

The pixel portion 110 including these display media 118 can be operated by being combined with the above-mentioned driver circuit.

When employed as the display medium 118, a light-emitting element formed using an electroluminescent material is more suitable for a time gray scale method than a liquid crystal element because its response speed is higher than that of a liquid crystal element or the like. For example, in the case of performing display by a time gray scale method, one frame period is divided into a plurality of subframe periods. Then, in accordance with video signals, the light-emitting element is set in a light-emitting state or in a non-light-emitting state during each subframe period. By dividing one frame period into a plurality of subframe periods, the total length of time, in which pixels actually emit light during one frame period, can be controlled with video signals so that gray scales can be displayed.

Figure 10:
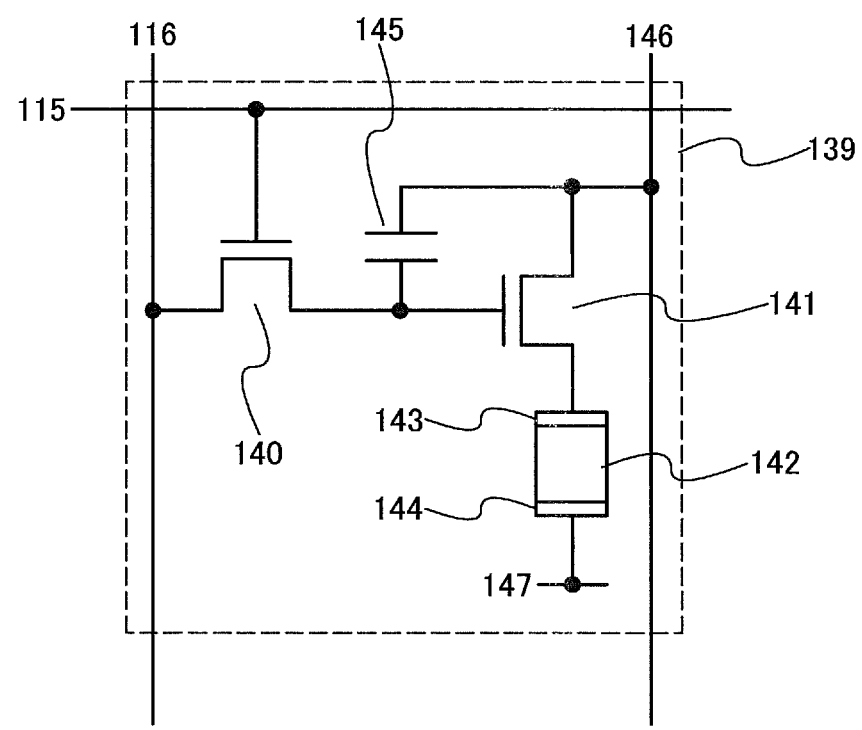
FIG. 10 is an equivalent circuit diagram of a pixel including a TFT with an oxide semiconductor layer and a light-emitting element.

An example of a pixel in the case where the pixel portion 110 includes light-emitting elements is illustrated in FIG. 10. FIG. 10 illustrates a structure of a pixel to which digital time gray scale driving can be applied. Described here is an example in which two n-channel thin film transistors each formed using an oxide semiconductor layer for a channel formation region are included in one pixel.

A pixel 139 includes a switching TFT 140, a driving TFT 141, a light-emitting element 142, and a capacitor 145. A gate of the switching TFT 140 is connected to a scan line 115; a first electrode (one of a source electrode and a drain electrode) of the switching TFT 140 is connected to a signal line 116; and a second electrode (the other of the source electrode and the drain electrode) of the switching TFT 140 is connected to a gate of the driving TFT 141. The gate of the driving TFT 141 is connected to a power supply line 146 through the capacitor 145; a first electrode of the driving TFT 141 is connected to the power supply line 146; and a second electrode of the driving TFT 141 is connected to a first electrode (a pixel electrode) 143 of the light-emitting element 142. A second electrode (a counter electrode) 144 of the light-emitting element 142 is connected to a common potential line 147.

The second electrode (the counter electrode) 144 of the light-emitting element 142 is set to have a low power supply potential. Note that the low power supply potential refers to a potential satisfying the formula (the low power supply potential)<(a high power supply potential) based on the high power supply potential set to the power supply line 146. As the low power supply potential, GND, 0 V, or the like may be set, for example. In order to make the light-emitting element 142 emit light by applying a potential difference between the high power supply potential and the low power supply potential to the light-emitting element 142 so that current is supplied to the light-emitting element 142, each of the potentials is set so that the potential difference between the high power supply potential and the low power supply potential is equal to or higher than the forward threshold voltage of the light-emitting element 142.

In the case of a voltage-input voltage driving method, a video signal is input to the gate of the driving TFT 141 such that the driving TFT 141 is in either of two states of being sufficiently turned on and turned off. That is, the driving TFT 141 operates in the linear region. A voltage higher than a voltage of the power supply line 146 is applied to the gate of the driving TFT 141 so that the driving TFT 141 operates in the linear region. Note that a voltage equal to or higher than the voltage represented by the formula (the voltage of the power supply line)+(the threshold voltage of the driving TFT 141) is applied to the signal line 116.

Instead of digital time gray scale driving, analog gray scale driving can also be applied to the structure of the pixel illustrated in FIG. 10. In the case of analog gray scale driving, a voltage equal to or higher than the voltage represented by the formula (the forward voltage of the light-emitting element 142)+(the threshold voltage of the driving TFT 141) is applied to the gate of the driving TFT 141. The forward voltage of the light-emitting element 142 refers to a voltage needed for a desired luminance and includes at least a forward threshold voltage. Note that when a video signal by which the driving TFT 141 operates in the saturation region is input, current can be supplied to the light-emitting element 142. The potential of the power supply line 146 is set higher than the gate potential of the driving TFT 141 so that the driving TFT 141 operates in the saturation region. When the video signal is an analog signal, current in accordance with the video signal can be supplied to the light-emitting element 142 and analog gray scale driving can be performed.

Although FIG. 10 illustrates the example in which the driving TFT 141 which controls the driving of the light-emitting element 142 is electrically connected to the light-emitting element, a structure may be employed in which a current controlling TFT is connected between the driving TFT 141 and the light-emitting element 142.

Although FIG. 5 illustrates the example of the display device 109 in which the selector circuit 112 for selecting the signal lines 116 is provided, the function of the driver IC 114 can be realized with a thin film transistor formed using an oxide semiconductor layer for a channel formation region when the thin film transistor has a field-effect mobility as high as 10 cm/V·sec or more. That is, the scan line driver circuit and the signal line driver circuit can be formed over the substrate 101 with thin film transistors which are each formed using an oxide semiconductor layer for a channel formation region.

(Light-Emitting Device)

Figure 11:
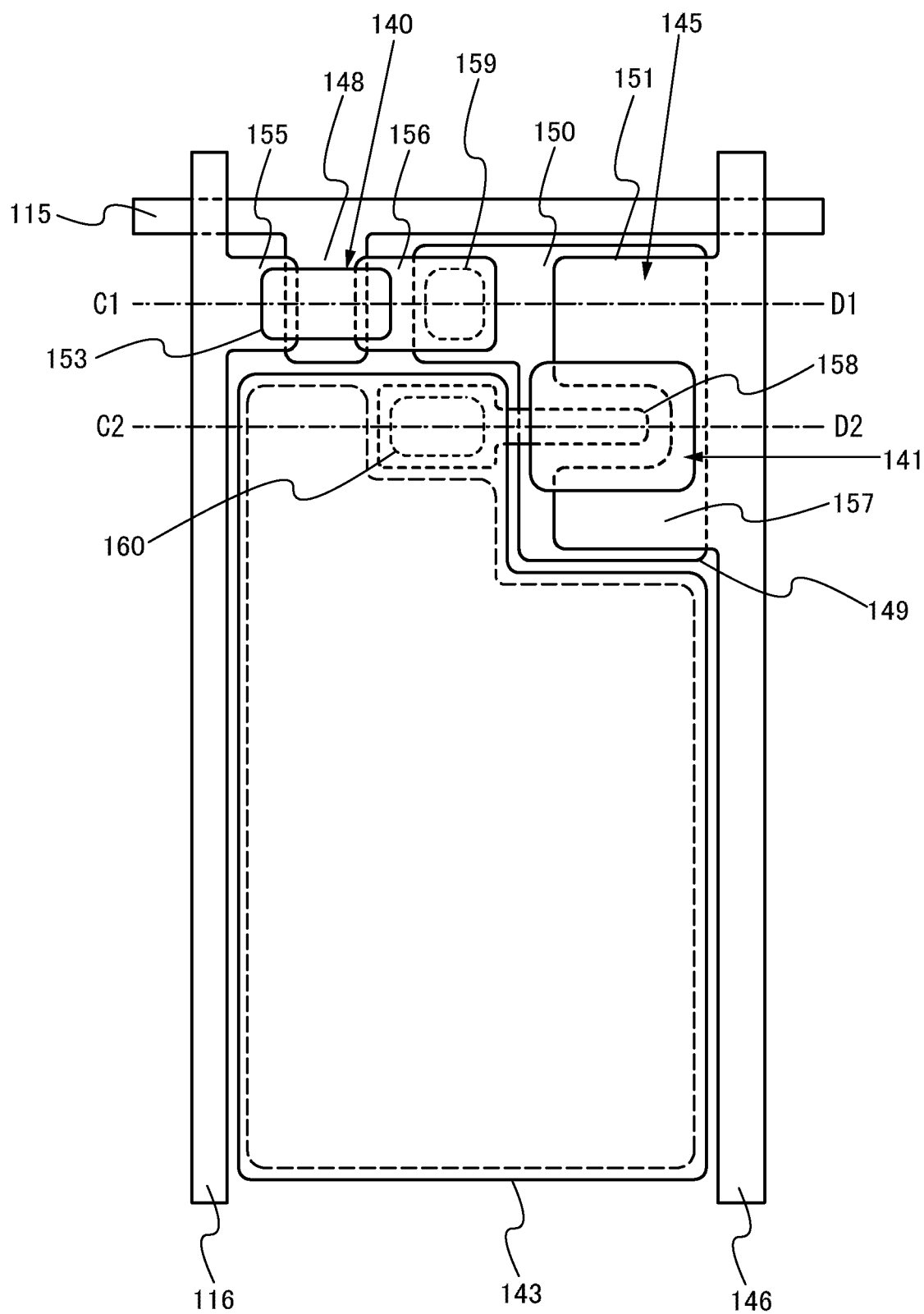
FIG. 11 is a plan view illustrating a pixel structure of a light-emitting device including a TFT with an oxide semiconductor layer.
Figure 12A:
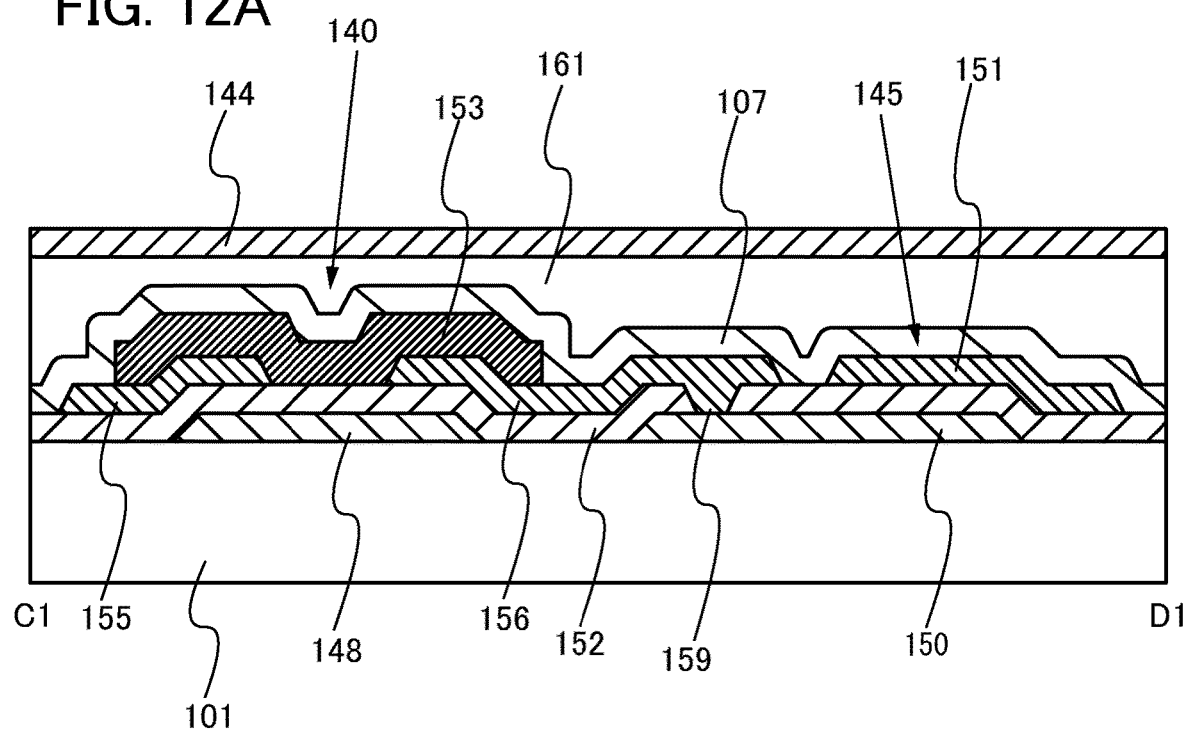
FIGS. 12A and 12B are cross-sectional views illustrating a pixel structure of a light-emitting device including a TFT with an oxide semiconductor layer.
Figure 12B:
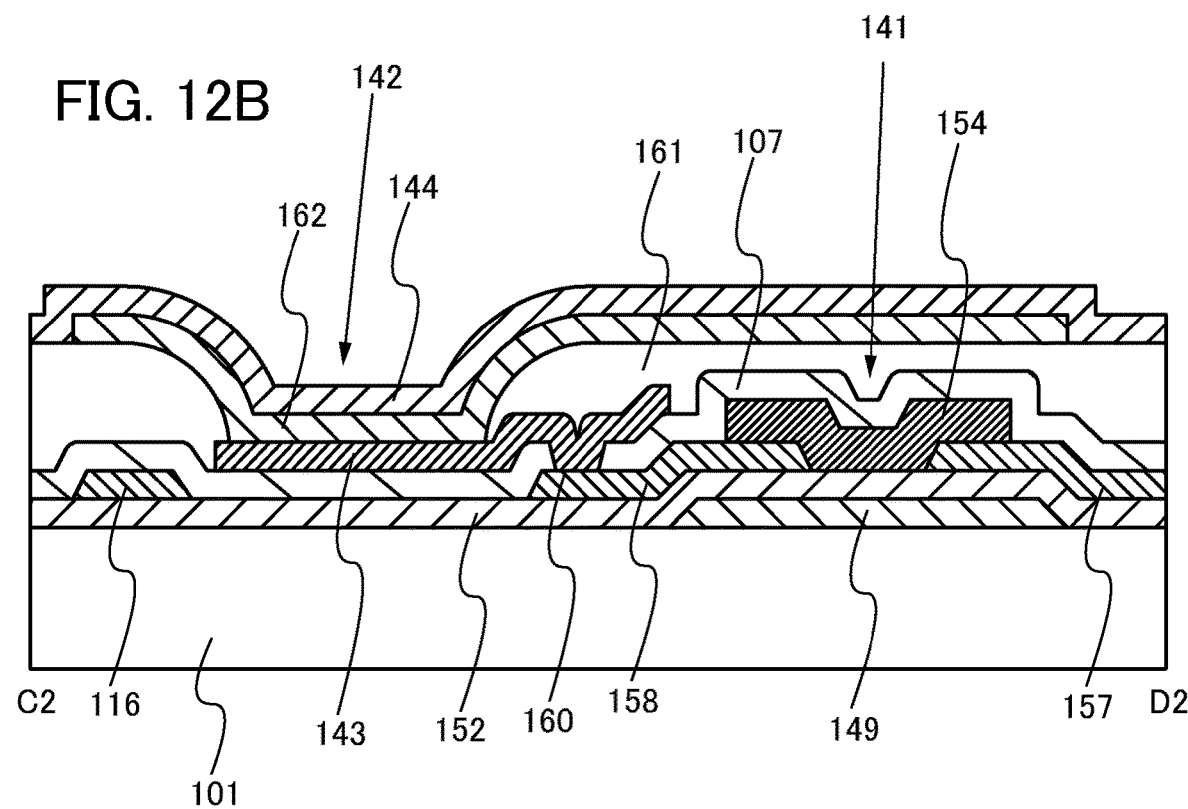

A structure of a pixel of a light-emitting device, which is one mode of a display device, will be described with reference to FIG. 11 and FIGS. 12A and 12B. FIG. 11 is an example of a plan view of a pixel; FIG. 12A is a cross-sectional view taken along a line C1-D1; and FIG. 12B is a cross-sectional view taken along a line C2-D2. In the following description, FIG. 11 and FIGS. 12A and 12B are referred to. Note that an equivalent circuit of the pixel illustrated in FIG. 11 is similar to that in FIG. 10.

A channel formation region of a switching TFT 140 is formed in an oxide semiconductor layer 153. The oxide semiconductor layer 153 is similar to that which is described in this embodiment. The switching TFT 140 has a gate electrode 148 formed with the same layer as a scan line 115, and the oxide semiconductor layer 153 is provided over a gate insulating layer 152. The oxide semiconductor layer 153 is in contact with a source/drain electrode 155 and a source/drain electrode 156 which are formed with the same layer as a signal line 116 over the gate insulating layer 152. The source/drain electrode 156 is connected to a gate electrode 149 of a driving TFT 141 via a contact hole 159 which is provided in the gate insulating layer 152.

Note that the term "source/drain electrode" refers to an electrode provided in a thin film transistor including a source, a drain, and a gate as its major components, at a portion serving as the source or the drain.

The signal line 116, the source/drain electrode 155, and the source/drain electrode 156 are preferably formed with an Al film or an Al film to which Si, Ti, Nd, Sc, Cu, or the like is added, so that the resistance of a wiring or an electrode can be lowered. A layer of a refractory metal typified by Mo, Cr, or Ti is preferably provided over and/or under the Al film so that the generation of hillocks or whiskers on the Al film can be prevented.

The gate electrode 149 functions also as a capacitor electrode 150 of a capacitor 145. The capacitor 145 is formed by stacking the capacitor electrode 150, the gate insulating layer 152, and a capacitor electrode 151 which is formed with the same layer as a power supply line 146.

The gate electrode 149 of the driving TFT 141 is formed with the same layer as the scan line 115, and an oxide semiconductor layer 154 is provided over the gate insulating layer 152. The oxide semiconductor layer 154 is in contact with a source/drain electrode 157 and a source/drain electrode 158 which are formed with the same layer as the power supply line 146 over the gate insulating layer 152.

Over the oxide semiconductor layer 153 and the oxide semiconductor layer 154, an oxide insulating layer 107 is provided. A first electrode (a pixel electrode) 143 is provided over the oxide insulating layer 107. The first electrode (the pixel electrode) 143 and the source/drain electrode 158 are connected to each other via a contact hole 160 provided in the oxide insulating layer 107. A partition layer 161 having an opening to the first electrode (the pixel electrode) 143 is formed with an inorganic insulating material or an organic insulating material. The partition layer 161 is formed such that its end portion at the opening has a gently curved surface.

A light-emitting element 142 has a structure in which an EL layer 162 is provided between the first electrode (the pixel electrode) 143 and a second electrode (a counter electrode) 144. One of the first electrode (the pixel electrode) 143 and the second electrode (the counter electrode) 144 is a hole injecting electrode; the other is an electron injecting electrode. The hole injecting electrode is preferably formed with a material which has a work function of 4 eV or higher, and a material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added is used. The electron injecting electrode is preferably formed with a material which has a work function lower than 4 eV, and calcium (Ca), aluminum (Al), calcium fluoride (CaF), magnesium silver (MgAg), aluminum lithium (AlLi), or the like is desirable. The EL layer 162 is a layer for obtaining light emission by electroluminescence and is formed by combining a carrier (hole or electron) transporting layer and a light-emitting layer as appropriate.

Figure 13A:
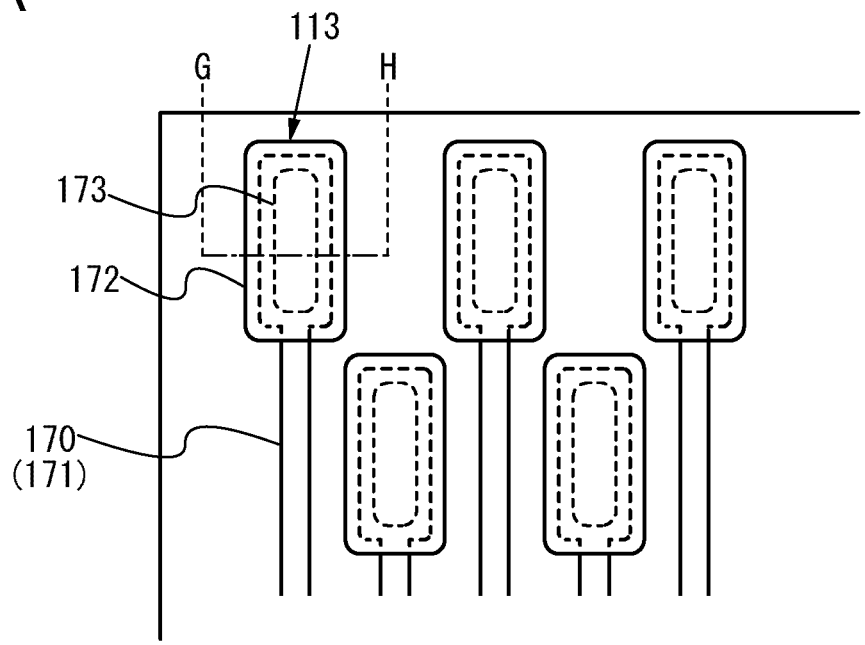
FIG. 13A to 13C are diagrams illustrating an input terminal portion of a light-emitting device including a TFT with an oxide semiconductor layer.
Figure 13B:
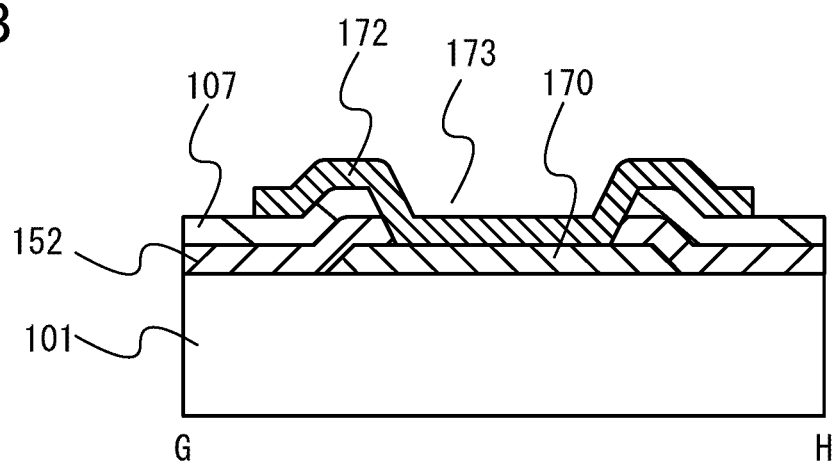
Figure 13C:
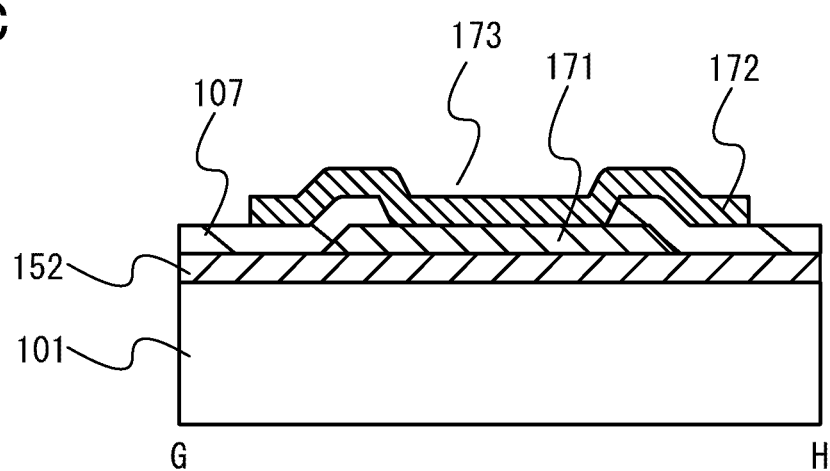

FIGS. 13A to 13C illustrate a structure of an input terminal 113 of the light-emitting device. FIG. 13A is a plan view of the input terminal 113. The input terminal 113 is provided at an end of the substrate 101. A cross-sectional view taken along a line G-H in FIG. 13A is illustrated in FIG. 13B or FIG. 13C.

FIG. 13B illustrates an example in which an input terminal layer 170 is formed with the same layer as the scan line 115. Over the input terminal layer 170, the gate insulating layer 152 and the oxide insulating layer 107 are stacked, and an opening 173 is provided in these insulating layers so that the input terminal layer 170 is exposed through the opening 173 in the insulating layers. The opening 173 is covered with a transparent conductive film 172 which is in contact with the input terminal layer 170. The transparent conductive film 172 is provided in order to avoid high contact resistance when a flexible printed wiring and the input terminal 113 are connected. The oxidation of a surface of the input terminal layer 170 which is formed of a metal leads to an increase in contact resistance; the increase in contact resistance can be prevented in the case where the transparent conductive film 172 formed with an oxide conductive material is provided.

FIG. 13C illustrates an example in which the input terminal layer 171 is formed with the same layer as the signal line 116. Over the input terminal layer 171, the oxide insulating layer 107 is provided, and the opening 173 is provided in this insulating layer so that the input terminal layer 171 is exposed through the opening 173 in the insulating layer. The transparent conductive film 172 is provided for the same reason as above.

(Contrast Medium Display Device)

Figure 14:
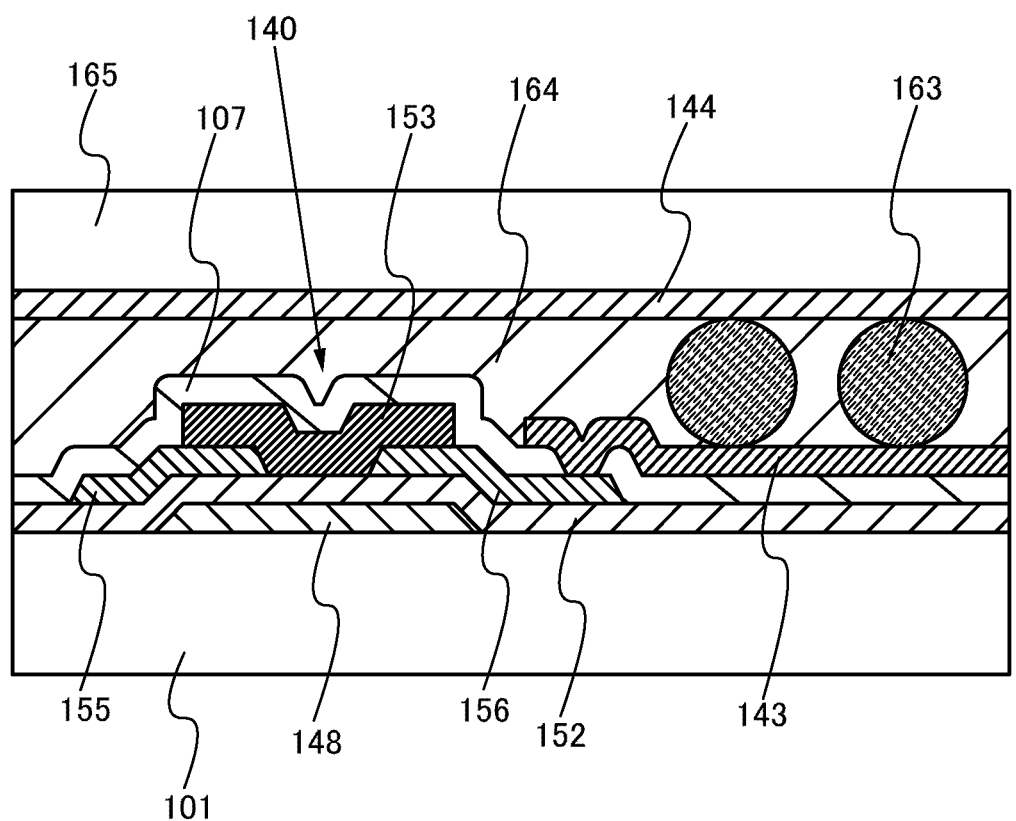
FIG. 14 is a cross-sectional view illustrating a structure of a contrast medium display device (electronic paper) including a TFT with an oxide semiconductor layer.

FIG. 14 illustrates one mode of a display device including a contrast medium 163 (such a display device is also called "electronic paper"). The contrast medium 163 is held between the first electrode (the pixel electrode) 143 and the second electrode (the counter electrode) 144 together with a filler 164 and changes its contrast when a potential difference is applied between the electrodes. The second electrode (the counter electrode) 144 is provided on the counter substrate 165.

For example, there is a display method, which is called a twisting ball display method, in which spherical particles each colored in white and black are disposed between the first electrode (the pixel electrode) 143 and the second electrode (the counter electrode) 144 and the orientation of the spherical particles is controlled by a potential difference generated between the electrodes.

Instead of the twisting balls, an electrophoretic element can also be used. A microcapsule having a diameter of approximately 10 μm to 200 μm, in which a transparent filler 164, positively charged white microparticles, and negatively charged black microparticles are encapsulated, is used. The microcapsule is sandwiched between the first electrode (the pixel electrode) 143 and the second electrode (the counter electrode) 144, and the positively charged white microparticles and the negatively charged black microparticles are moved separately in different directions by a potential difference between the electrodes. A display element using this principle is an electrophoretic display element and is generally called electronic paper. The electrophoretic display element has a higher reflectivity than a liquid crystal display element and accordingly does not require an auxiliary light and consumes less power, and a display portion can be recognized even in a dim place. In addition, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

(Liquid Crystal Display Device)

Figure 15:
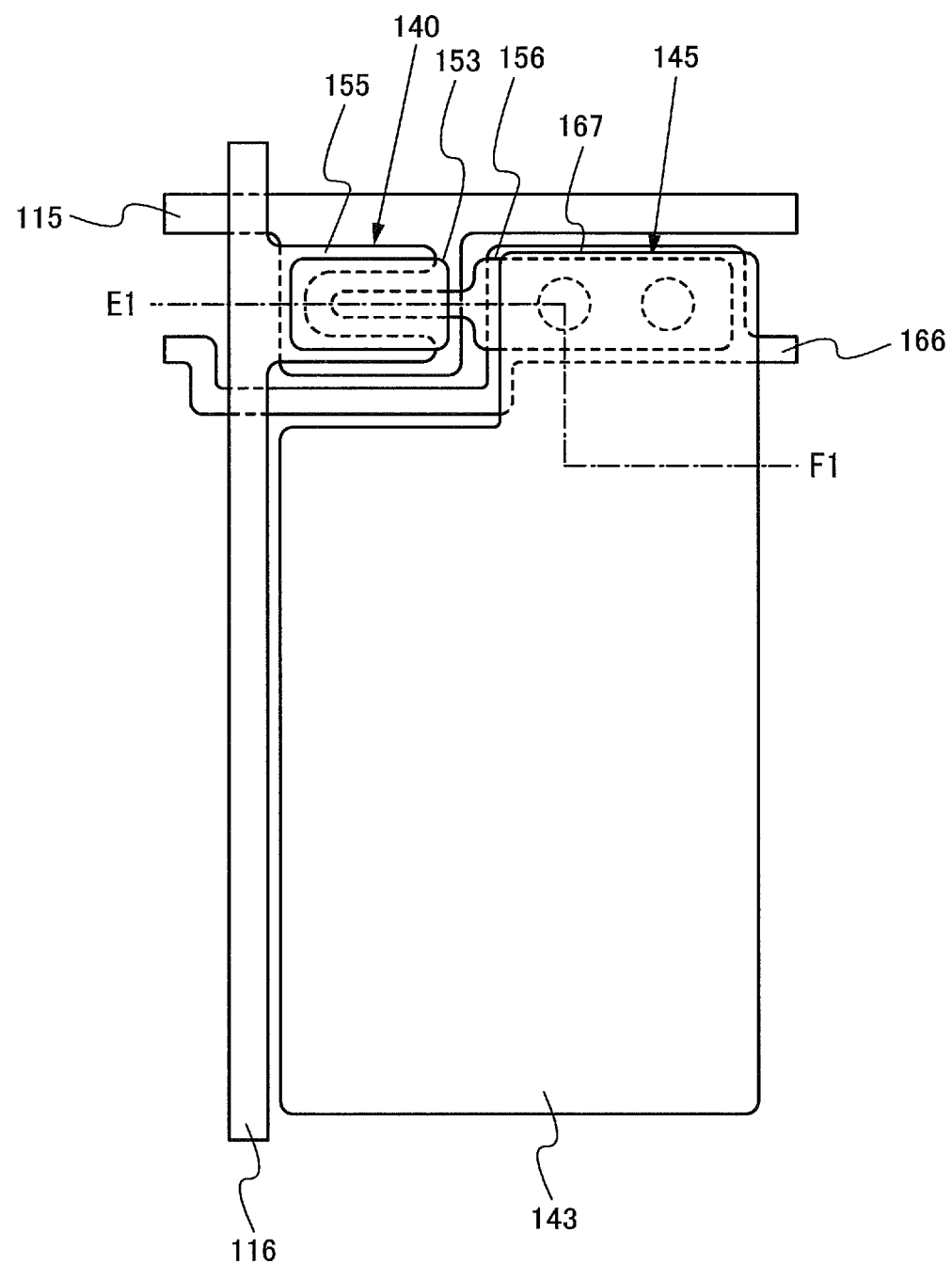
FIG. 15 is a plan view illustrating a pixel structure of a liquid crystal display device including TFT with an oxide semiconductor layer.
Figure 16:
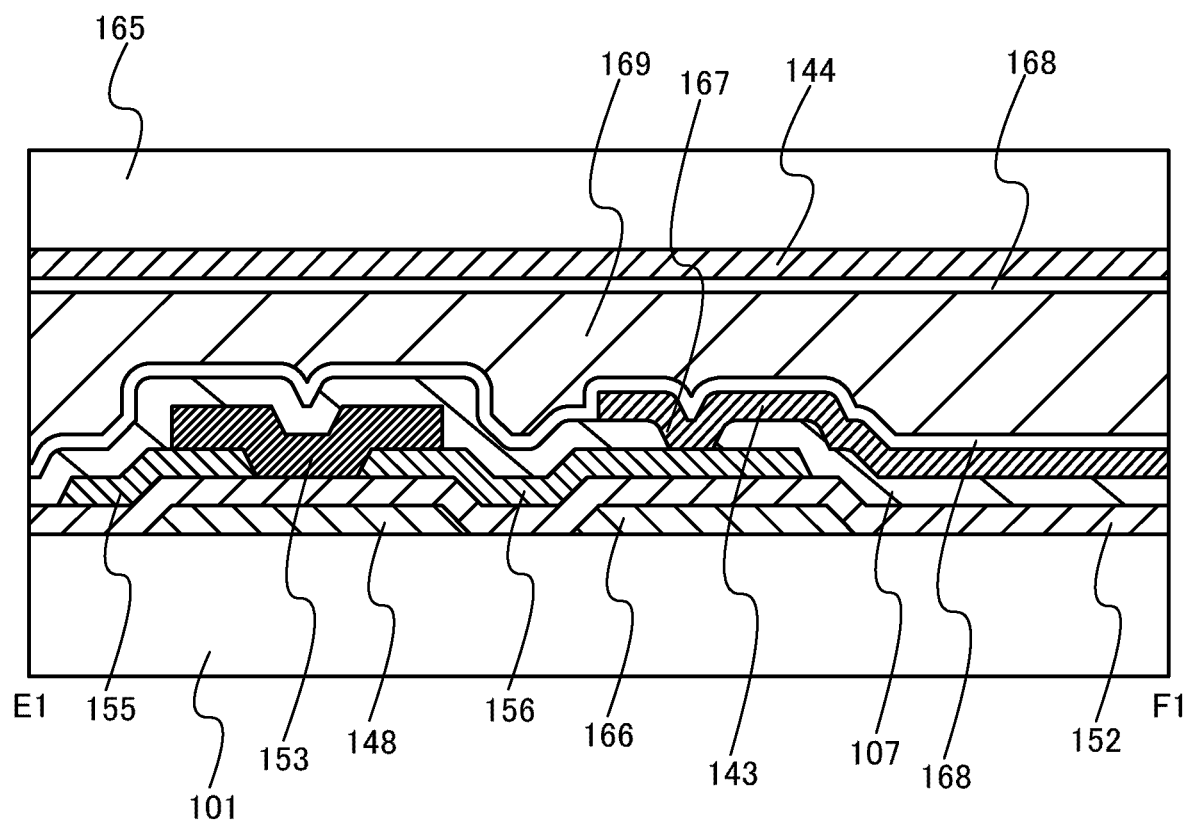
FIG. 16 is a cross-sectional view illustrating a pixel structure of a liquid crystal display device including TFT with an oxide semiconductor layer.

A structure of a pixel of a liquid crystal display device, which is one mode of a display device, will be described with reference to FIG. 15 and FIG. 16. FIG. 15 is a plan view of a pixel, and FIG. 16 is a cross-sectional view taken along a line E1-F1. In the following description, FIG. 15 and FIG. 16 are referred to.

A pixel of a liquid crystal display device illustrated in FIG. 15 and FIG. 16 includes a switching TFT 140 which is connected to a scan line 115 and a signal line 116. A source/drain electrode 155 of the switching TFT 140 is connected to the signal line 116, and a source/drain electrode 156 thereof is connected to a first electrode (a pixel electrode) 143 via a contact hole 167 provided in an oxide insulating layer 107. A capacitor 145 is formed by stacking a capacitor line 166 which is formed with the same layer as a gate electrode 148, a gate insulating layer 152, and the source/drain electrode 156. A switching TFT 140 controls the input of a signal to the first electrode (the pixel electrode) 143. The structure of the switching TFT 140 is similar to that illustrated in FIG. 12A.

A liquid crystal layer 169 is provided between the first electrode (the pixel electrode) 143 and a second electrode (a counter electrode) 144. The first electrode (the pixel electrode) 143 is provided over the oxide insulating layer 107. Alignment films 168 are provided on the first electrode (the pixel electrode) 143 and the second electrode (the counter electrode) 144.

As described above, a display device having excellent operation characteristics can be completed with a thin film transistor whose channel formation region is formed in an oxide semiconductor layer in accordance with this embodiment.

Example 1

(Composition of Oxide Semiconductor Layer)

Oxide semiconductor layers were formed over glass substrates by a sputtering method under the conditions described below.
(Condition 1)
Target composition: $In_2O_3:Ga_2O_3:ZnO=1:1:1$
(In:Ga:Zn=1:1:0.5)
Ar gas flow rate: 40 sccm
Pressure: 0.4 Pa
Electric power (DC): 500 W
Substrate temperature: room temperature
(Condition 2)
Target composition: $In_2O_3:Ga_2O_3:ZnO=1:1:1$
(In:Ga:Zn=1:1:0.5)
Ar gas flow rate: 10 sccm
Oxygen gas flow rate: 5 sccm
Pressure: 0.4 Pa
Electric power (DC): 500 W
Substrate temperature: room temperature The oxide semiconductor layers formed under Conditions 1 and 2 were evaluated by inductively coupled plasma mass spectrometry (ICP-MS). Table 1 shows typical examples of measurement. The oxide semiconductor layer obtained under Condition 1 has a composition that is represented by the following formula: $InGa_{0.95}Zn_{0.41}O_{3.33}$. The oxide semiconductor layer obtained under Condition 2 has a composition that is represented by the following formula: $InGa_{0.94}Zn_{0.40}O_{3.31}$.

TABLE 1

| | Composition (atomic %) | | | | |
| --- | --- | --- | --- | --- | --- |
| | In | Ga | Zn | O | Composition formula |
| Condition 1 | 17.6 | 16.7 | 7.2 | 58.6 | $InGa_{0.95}Zn_{0.41}O_{3.33}$ |
| Condition 2 | 17.7 | 16.7 | 7 | 58.6 | $InGa_{0.94}Zn_{0.40}O_{3.31}$ |

As described above, the measurement by ICP-MS confirms that m in $InMO_3(ZnO)_m$ is not an integer number. In addition, the proportions of components confirm that the concentration of Zn is lower than the concentrations of In and Ga.

(Structure of Oxide Semiconductor Layer)

A structure of an oxide semiconductor layer formed to a thickness of 400 nm over a glass substrate under Condition 2 described above was evaluated by X-ray diffraction.

Figure 17:
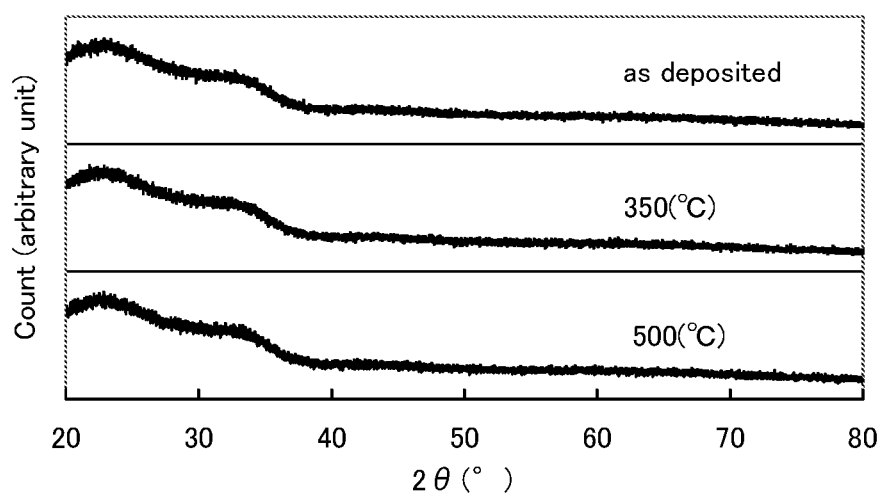
FIG. 17 is a graph showing X-ray diffraction patterns of an oxide semiconductor layer (after deposition, after heat treatment at 350° C., and after heat treatment at 500° C.).

FIG. 17 shows X-ray diffraction patterns of a sample (as-deposited) formed under Condition 2, a sample after being subjected to heat treatment at 350° C. in a nitrogen atmosphere for one hour after the deposition, and a sample after being subjected to heat treatment at 500° C. in a nitrogen atmosphere for one hour after the deposition. A halo pattern was observed in all of the samples, which confirms that the samples have an amorphous structure.

Note that when a sample formed using a target whose composition ratio of $In_2O_3$ to $Ga_2O_3$ and ZnO was 1:1:2 was also evaluated by X-ray diffraction, the similar evaluation results were obtained, which confirms that the oxide semiconductor layer formed in this example has an amorphous structure.

(Characteristics of Thin Film Transistor)

Figure 18:
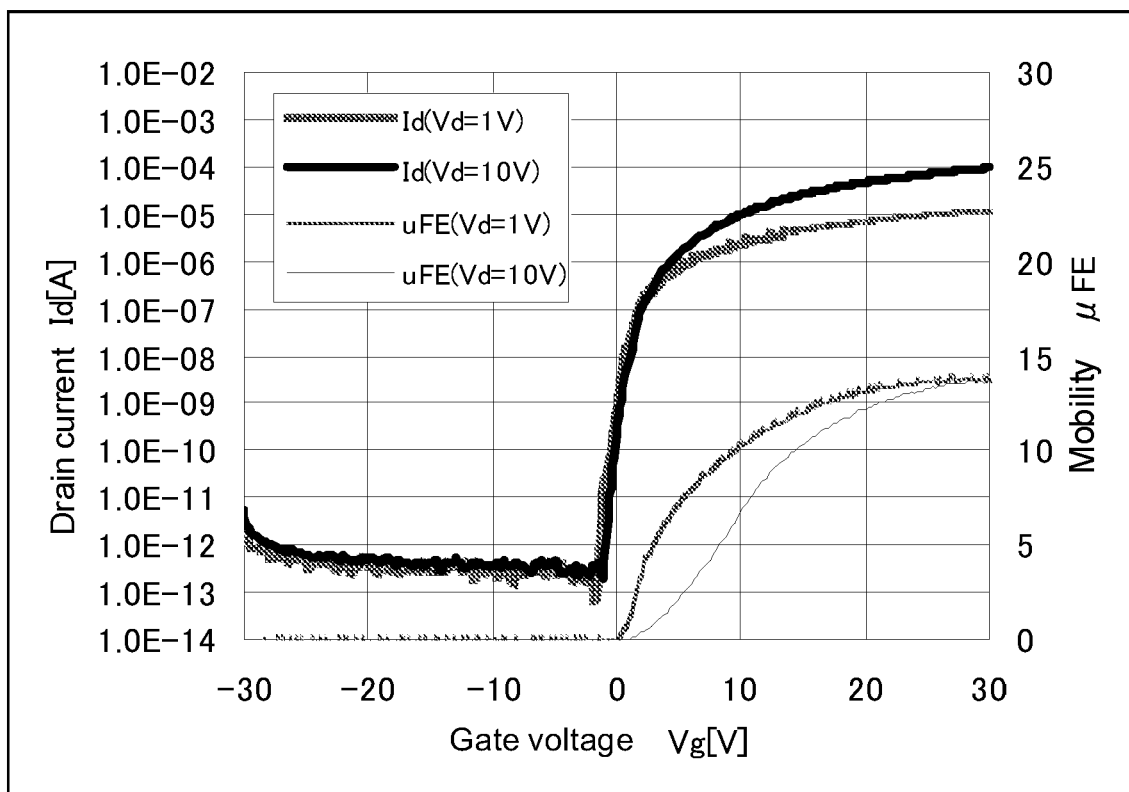
FIG. 18 is a graph showing gate voltage (Vg)-drain current (Id) characteristics of a thin film transistor.

FIG. 18 shows gate voltage (Vg)-drain current (Id) characteristics of a thin film transistor. The thin film transistor has a bottom gate structure illustrated in FIGS. 2A and 2B, and the channel length is 100 μm and the channel width is 100 μm. The oxide semiconductor layer was formed under Condition 2 described above. A field effect mobility of greater than or equal to 15 cm²/V·sec, an off current of less than or equal to $1\times10^{-11}$ A, and a ratio of on current to off current (an on-off ratio) of greater than or equal to $10^8$ were obtained. As described above, the thin film transistor having a high on-off ratio which could not be obtained with conventional thin film transistors could be obtained.

This application is based on Japanese Patent Application serial no. 2008-274564 filed with Japan Patent Office on Oct. 24, 2008, the entire contents of which are hereby incorporated by reference.

What is claimed is:

1. A light-emitting device comprising:
a pixel portion comprising:
a first transistor comprising:
a gate electrode;
a first insulating layer over and in contact with the gate electrode;
a first oxide semiconductor layer over and in contact with the first insulating layer, the first oxide semiconductor layer comprising a channel formation region;
a first conductive layer electrically connected to the first oxide semiconductor layer;
a second conductive layer electrically connected to the first oxide semiconductor layer; and
a second insulating layer over and in contact with the first conductive layer and the second conductive layer; and
a light-emitting element comprising:
a first electrode electrically connected to one of the first conductive layer and the second conductive layer through a contact hole in the second insulating layer;
an electroluminescent layer over the first electrode; and
a second electrode over the electroluminescent layer and a partition layer; and
a driver circuit electrically connected to the pixel portion, the driver circuit comprising a second transistor,
wherein the second transistor comprises a second oxide semiconductor layer comprising a channel formation region, wherein each of the first oxide semiconductor layer and the second oxide semiconductor layer comprises In, Ga, and Zn, wherein a concentration of Zn is lower than a concentration of In or a concentration of Ga in each of the first oxide semiconductor layer and the second oxide semiconductor layer, wherein an end portion of each of the first conductive layer and the second conductive layer has a tapered shape, and wherein an end portion of the partition layer has a curved surface.

2. The light-emitting device according to claim 1, further comprising a capacitor comprising the gate electrode.

3. The light-emitting device according to claim 1, wherein the gate electrode comprises a first layer comprising Ti, and a second layer comprising Cu over the first layer.

4. The light-emitting device according to claim 1, wherein the gate electrode comprises a first layer comprising Mo, and a second layer comprising Cu over the first layer.

5. The light-emitting device according to claim 1, wherein each of the first conductive layer and the second conductive layer comprises a layer comprising Cu.

6. The light-emitting device according to claim 1, wherein each of the first oxide semiconductor layer and the second oxide semiconductor layer comprises a nanocrystal.

7. The light-emitting device according to claim 1, wherein each of the first oxide semiconductor layer and the second oxide semiconductor layer is a non-single-crystal semiconductor layer.

8. A light-emitting device comprising:
a pixel portion comprising:
a first transistor comprising:
a gate electrode;
a first insulating layer over and in contact with the gate electrode;
a first oxide semiconductor layer over and in contact with the first insulating layer, the first oxide semiconductor layer comprising a channel formation region;
a first conductive layer electrically connected to the first oxide semiconductor layer;
a second conductive layer electrically connected to the first oxide semiconductor layer; and
a second insulating layer over and in contact with the first conductive layer and the second conductive layer; and a light-emitting element comprising:
a first electrode electrically connected to one of the first conductive layer and the second conductive layer through a contact hole in the second insulating layer;
an electroluminescent layer over the first electrode; and
a second electrode over the electroluminescent layer and a partition layer; and
a driver circuit electrically connected to the pixel portion, the driver circuit comprising a second transistor,
wherein the second transistor comprises a second oxide semiconductor layer comprising a channel formation region,
wherein each of the first oxide semiconductor layer and the second oxide semiconductor layer comprises In, Ga, and Zn,
wherein a concentration of Zn is lower than a concentration of In or a concentration of Ga in each of the first oxide semiconductor layer and the second oxide semiconductor layer,
wherein an end portion of each of the first conductive layer and the second conductive layer has a tapered shape, and
wherein an end portion of the partition layer has a curved surface, and
wherein each of the first insulating layer and the second insulating layer comprises silicon and oxygen.

9. The light-emitting device according to claim 8, further comprising a capacitor comprising the gate electrode.

10. The light-emitting device according to claim 8, wherein the gate electrode comprises a first layer comprising Ti, and a second layer comprising Cu over the first layer.

11. The light-emitting device according to claim 8, wherein the gate electrode comprises a first layer comprising Mo, and a second layer comprising Cu over the first layer.

12. The light-emitting device according to claim 8, wherein each of the first conductive layer and the second conductive layer comprises a layer comprising Cu.

13. The light-emitting device according to claim 8, wherein each of the first oxide semiconductor layer and the second oxide semiconductor layer comprises a nanocrystal.

14. The light-emitting device according to claim 8, wherein each of the first oxide semiconductor layer and the second oxide semiconductor layer is a non-single-crystal semiconductor layer.

* * * * *